United States Patent [19]

Andricos

[11] Patent Number: 5,093,667

[45] Date of Patent: Mar. 3, 1992

[54] T/R MODULE WITH ERROR CORRECTION

[75] Inventor: Constantine Andricos, Pasadena, Calif.

[73] Assignee: ITT Corporation, New York, N.Y.

[21] Appl. No.: 422,364

[22] Filed: Oct. 16, 1989

[51] Int. Cl.[5] .......................... H03F 3/68; H01Q 3/26
[52] U.S. Cl. .................................. 342/372; 342/368; 330/130; 330/200
[58] Field of Search ............... 330/200, 199, 295, 297, 330/130; 342/165, 368, 371, 372

[56] References Cited

U.S. PATENT DOCUMENTS

| | | | |
|---|---|---|---|
| 4,158,179 | 6/1979 | Sakai et al. | 330/199 X |
| 4,454,480 | 6/1984 | Allfather et al. | 330/297 |
| 4,724,441 | 2/1988 | Fithian et al. | 342/ |
| 4,791,421 | 12/1988 | Morse et al. | 342/ |
| 4,924,191 | 5/1990 | Erb et al. | 330/130 |

FOREIGN PATENT DOCUMENTS 2847375  5/1979  Fed. Rep. of Germany ...... 330/200

*Primary Examiner*—Mark Hellner
*Attorney, Agent, or Firm*—Arthur L. Plevy

[57] ABSTRACT

A C-band transmit-receive module for an active aperture radar is provided employing gallium arsenide chips preferably manufactured by the Multifunction Self-Aligned Gate process and employing both open and closed loop error correction for both phase and amplitude to correct for errors due to temperature, power supply variations, operating bandwidth and phase states.

In a second embodiment a power output amplifier is provided employing predriver, driver and power amplifier stages wherein the power amplifier or the power amplifier and the driver may be switched out of the circuit if not needed. The bias on the amplifier may also be lowered if not needed. This is done to increase efficiency and reduce temperature.

In both embodiments class B amplifier are preferred.

19 Claims, 16 Drawing Sheets

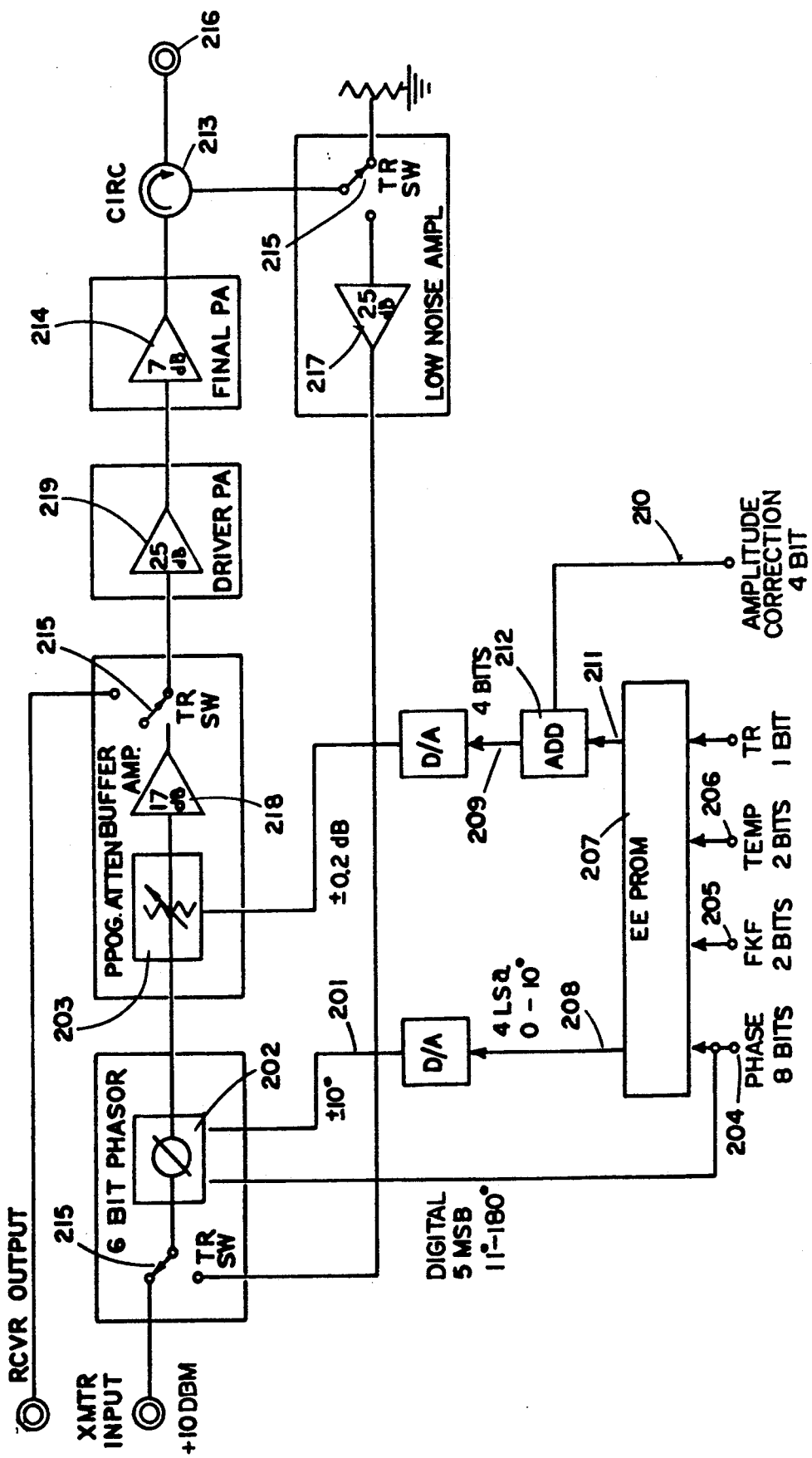

T/R MODULE WITH ERROR CORRECTION

BACKGROUND OF THE INVENTION

1. Field of the Invention

The present invention relates to electronic supervision and control equipment for a radar installation. More specifically, a transmit/receive module is provided which has operating modes specifically directed to several desirable features of a phased array radar installation. Among the operating modes available are, an antenna command mode, a receive mode, a transmit mode, a receive-calibrate mode, a BIT/FIT mode and a transmit-calibrate mode. Error correction is provided in both an open loop and a closed loop mode to compensate for deviations from desired performance.

2. Description of the Prior Art

In the use of radar antennae in systems of the type designed for precisely locating remote airborne objects, some of which may be taking active steps to avoid being detected, it is extremely important that the radar antenna perform exactly in accordance with the intended manner of operation. The control of the antenna and the manipulation of the signals transmitted and received by the antenna are performed in part by electronic, electrical or electromechanical equipment having very tight operating tolerances. It has been a continuing objective to improve the performance of antenna control equipment and the associated radar performance.

A component of advanced radar control equipment which provides control over the rapid scanning of the environment via an active aperture array type radar is commonly referred to as a transmit/receive module (T/R module). The use of advanced equipment employing T/R modules overcomes the severe technical problems which limit the performance of traditional mechanically scanned radar equipment. Mechanical scanning via antenna rotation is eliminated in favor of electronic phase shifting of signals transmitted (and received) by a stationary antenna array. By providing a separate T/R module associated with each element of the antenna array, extremely fast directional changes may be made in the beam direction without the need for any physical rotation of the antenna structure. This ultrafast beam-direction pointing is made possible through the precise electronic control of the phase of the signal at each antenna element.

The overall operation of an electronically scanned antenna involves the provision of a signal to be transmitted, splitting the signal into a plurality of signal paths, each path being associated with an individual element of the antenna array, and directing the signal, via these signal paths, to each element of the antenna array with the phase of the signal at each element modified as necessary to cause the transmitted signal to form a beam which is pointed in a desired direction. In the receive mode, the phased array antenna system is also directional, this time providing directional control by adjusting the phase of the signals received at each element of the array such that signals from the desired direction are additive and signals from other directions tend to cancel each other out when added together since they are not in proper phase relation. This is done by providing a phase shifter in the signal reception path from each element and then combining the "in phase" signals in a power combiner to obtain the signal received from the predetermined direction.

In addition to the improved control over beam-direction pointing, the T/R module may be employed at the receiver front end in conjunction with a low-noise amplifier (preamplifier) to improve the sensitivity of the radar by eliminating the transmission losses from the antenna to the preamplifiers of common radars where there is no T/R module. Another improvement offered is in system efficiency where the application of power gain at each element avoids losses associated with corporate-fed power splitting arrangements previously employed.

A phase shifting function can be performed by any number of techniques well known to those familiar with phased array radar systems. Examples of various phase shifting approaches are disclosed in U.S. Pat. No. 4,044,360 and in a textbook referenced therein entitled "RADAR HANDBOOK" by Merrill I. Skolnik (McGraw-Hill 1970). The use of phase shifters in radar applications to provide phased array radars is well known. An example of a phased array radar is shown in U.S. Pat. No. 3,990,077, "Electrically Scanned Antenna For Direction Error Measurement", filed in 1975.

The necessity for providing identical signals to each antenna element, although phase shifted with respect to each other, has presented a challenging phase shifting coordination problem. One type of arrangement previously employed is known as the space-feed phased array radar. In this approach, a signal may be radiated from a horn onto the back surface of a panel of the array. An array of openings in the panel are fitted with feed-through type elements which receive a portion of the radiated signal, provide a preprogrammed phase shift, and re-radiate the signal. The programming of the phase shift of each of the feed-through radiator elements is the control mechanism for beam pointing. This approach represented a significant improvement over the previously employed corporate-feed arrangements due to the complexity of the hardware needed to precisely provide the signal to each of the radiating elements U S. Pat. No. 4,044,360, mentioned above, explains the benefits of the space-feed relative to corporate feed arrangements.

An early disclosure of the use of phase shifters to provide control over beam pointing is U.S. Pat. No. 3,864,689 "Hybrid Scan Antenna", filed in 1973, where the use of multiple wave-guide antenna sections are made to simulate a single longer section. In 1978, application was made for a system to simplify the previously complex corporate-fed phased array antenna systems and the resulting U.S. Pat. No. 4,257,050 "Large Element Antenna Array With Grouped Overlapped Apertures" discloses a system where, for instance, 40 beamwidths of scanning may be accomplished through the use of only 8 phase shifters and 8 mini-position switches. A semiconductor based phase shifter suitable for operation at frequencies of several Ghz/s is disclosed in U.S. Pat. No. 4,450,372 "Electronic Control Variable Phase Shift Device Comprising A Long Gate Field-Effect Transistor And A Circuit Using Such A Device", filed in 1982. Still another approach to phase shifting is disclosed in U.S. Pat. No. 4,480,254 "Electronic Beam Steering Methods And Apparatus", filed in 1982 which discloses the use of dielectric prisms which provide phase shift in response to the electric field strength to which the prism is exposed.

U.S. Pat. No. 4,359,742 "Dual Switch Multimode Array Antenna", filed in 1980, discloses a radar antenna system operable in both a transmit and a receive mode. U.S. Pat. No. 4,376,281 "Multimode Array Antenna", filed in 1980, discloses another radar antenna system designed for both transmit and receive operation.

U.S Pat. No. 4,450,372, mentioned above, discloses a transmit/receive radar system which employs a separate phase shifter for each antenna element. T/R switches are shown with intervening transmit and receive channel circuitry. Within the T/R module for each antenna element there are phase shift elements provided in both the transmit channel and in the receive channel in order to provide antenna aiming, i.e., beam pointing. Separate control circuitry is employed to provide the control signals for directional control.

FIG. 1 shows a typical prior art antenna arrangement where terminal 101 receives a transmit drive signal for transmission, and receives the signals received by the antenna. Phase shifter 103 receives phase control signals via phase control lines 104a-d, and provides a properly phased signal in response to the receipt of either an incoming or outgoing signal. The phase control regulates the beam direction of the phased array antenna. T/R switch 105 selects either transmit or receive operation by connecting either the transmit branch 106 or the receive branch 108 between the phase shifter 103 and the antenna element 110. The power amp 107 amplifies signals to be transmitted when in the transmit mode, i.e., when the transmit branch is in the circuit, while preamplifier 109 amplifies received signals when the system operates in the receive mode, and the receive branch is in the circuit.

The arrangement of FIG. 1 is limited in overall performance due to the tight tolerances which must be met for performance improvements. For instance, when 60 dB sidelobe suppression is desired, 0.5 dB RMS amplitude and 5° RMS phase tracking are required. If sidelobe suppression of 75 dB is required, the system requirements are tightened. This would be fine if such tight tolerances could be met. However, even the tolerances for 60 dB sidelobe performance is stressing the capabilities of existing technology. Additionally, the prior T/R arrangements are subject to temperature variations, power-supply variations, duty cycle and pulse-width changes and frequency changes in normal operation. These effects result in large phase and amplitude variations in each module, causing poor tracking and sidelobe performance.

A phase correction circuit for a phase shifter is disclosed in U.S. Pat. No. 4,649,553 "Microwave Digital Phase-Shifter Apparatus And Method For Construction". This microwave digital diode phase shifter provides improved phase error and an improved carrier and spurious sideband suppression by utilizing a digital correction scheme. It also provides reduced amplitude modulation error by employing a GaAs amplifier operating at saturation.

SUMMARY OF THE INVENTION

In the present invention a C-band transmit/receive module is provided using gallium arsenide monolithic chips, manufactured by the Multifunction Self-Aligned Gate Process (MSAG) by ITT's Gallium Arsenide Technology Center, for an active aperture radar. Each module contains five GaAs chip packages consisting of (1) a six-bit programmable phase shifter using five digital bits and an analog bit, (2) a programmable attenuator, (3) a low noise preamp, (4) a driver, and (5) power output amplifier plus T/R switches. A power conditioner and a controller, both on thick film substrates, are incorporated for completely independent control.

Close phase and amplitude tracking is achieved over temperature, power supply variations, operating bandwidth and phase states by use of built-in correction and regulation circuitry.

In a second embodiment the components are differently arranged on four chips and a predriver, driver and power amplifier are connected so that the power amplifier or the driver and the power amplifier may be switched out of the circuit if not needed and the bias on these three amplifiers may be switched in order to reduce power requirements and heat dissipation. This is particularly advantageous since such a large number of T/R modules are required in a phased array radar. Class B amplification may be employed for increased efficiency.

In order to overcome the limitations encountered in the prior approaches both open loop and closed loop correction is used in both phase and amplitude. The open loop correction compensates for phase shift and amplitude errors over all phase states of the phase shifter, and also corrects for variations over the operating bandwidth and operating temperature range. The module gains and phases are all precalibrated to provide both receive and transmit gain within 0.5 dB and phase within 5° of the reference.

The quality of the open loop correction circuit is made to be as good as possible by employing state of the art GaAs technology. Through the use of GaAs components in the feedback circuit, advantage is taken of the extremely uniform device performance which can be obtained through tight quality control in the selection of matched GaAs devices.

Closed loop corrections can be inputted to the module when in service to correct for long term drifts to achieve and maintain low sidelobe performance for extended time periods under varying environmental conditions.

Additional Prior Art

Prior art to the switching feature is disclosed in U.S. Pat. No. 4,598,252, Andricos, assigned to the assignee of the present invention, which shows a scheme where amplifiers are connected in parallel and bias does not change.

Additional prior art illustrating phase correction is U.S. Statutory Invention Registration H173 Claborn et al. which discloses phase correction in a transmitter for temperature variations both at the aperture and at the power divider but does not disclose receiver correction nor amplitude correction. PROMs 48 and 74 in FIG. 3 of Claborn et al. contain the phase correction information which is combined in adder 78.

U.S. Pat. No. 4,652,883 Andricos, assigned to the assignee of the present invention, also discloses a five-bit phase shifter for preset phase shift plus an analog phase shifter for compensation for inaccuracy in the preset shifters.

BRIEF DESCRIPTION OF THE DRAWINGS

FIG. 2 shows a block diagram for the T/R module with amplitude and phase correction scheme;

DESCRIPTION OF THE PREFERRED EMBODIMENTS

Figure 1:
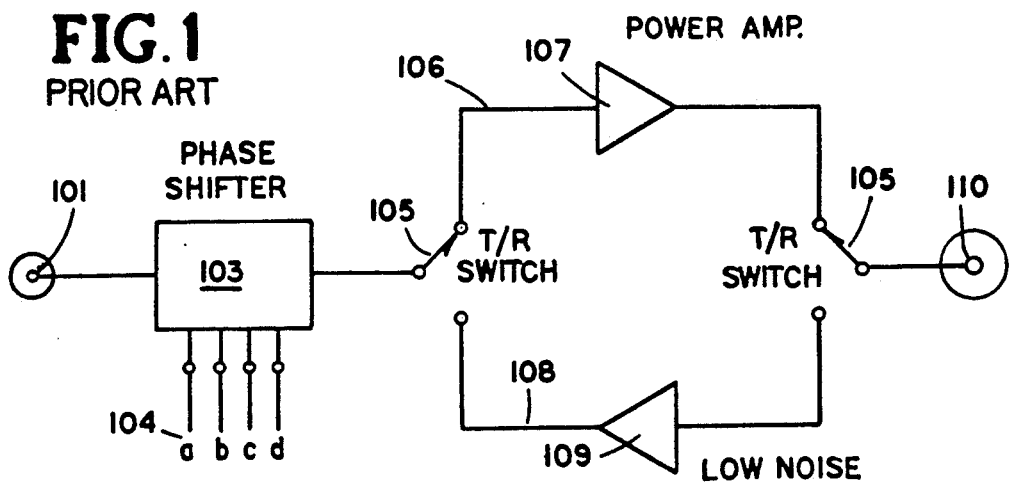
FIG. 1 illustrates a prior art transmit/receive approach.

The block diagram for the T/R module with amplitude and phase correction scheme is shown in FIG. 2. Phase corrections are produced by an analog phase bit 201 in the phase shifter 202 to within 1° while gain is corrected in an analog programmable attenuator 203 in 0.2 dB steps.

The input to the correctors 202 and 203 consists of a 13-bit phase code and a 4-bit amplitude correction. The former is made up of an 8-bit phase-shift setting 204, a 2-bit frequency setting 205, and a 2-bit temperature setting 206 for both the transmit and receive modes. An 8192×8 EEPROM 207 stores all 256 phase states for the 4 frequencies and 4 temperatures and for both receive and transmit modes. The EEPROM 207 output liens are divided into 4-bit phase correction 208 (1.25-degree resolution) an d4-bit amplitude correction 209 (0.25 dB resolution). The EEPROM 207 contains all the open loop correction terms which are inputted during the calibration of the modules. The temperature corrections adjust the phase and amplitude to correspond to the average temperature sensitivity slopes to that the module-to-module tracking is improved. The frequency input 205 adjusts for in-band amplitude and phase ripple. The temperature sensor for input 206 is located in each module controller board.

The 4-bit amplitude correction 210 adds a term to the compensated gain adjustment 21 in adder 212 to accommodate closed-loop gain adjustment for more accurate control. Closed-loop adjustment of the phase is accomplished through the 8-bit phase command word 204.

The module can be made through the use of 11 GaAs MMIC ICs mounted in five packages as shown. A ferrite circulator 213 protects the output of the power amp 214 from high Voltage Standing Wave Ratios, (VSWRs) during transmit mode, and in conjunction with a switch 215, routes signals from the antenna 216 to the low noise amplifier (LNA) 217 during receive mode. A buffer amplifier 218 is provided between attenuator 203 and switch 215.

The major assemblies of the T/R Module are:
(1) The programmable phase-shifter 202 consisting of five digitally controlled phase bits and an analog control bit which provides less than ±2 degrees of phase error for 11.25-degree, 22.5-degree and 45-degree bits. For 90-degree and 180-degree bits phase error is less than ±6 degrees over a 1-GHz bandwidth.
(2The programmable attenuation 203 using a dualgate FET to achieve 2 dB of gain control with constant VSWR and bandwidth. Less than 3 degrees of phase change over 5 dB of gain variation is achieved.
(3) The driver amplifier 219 providing 25 dB of gain with greater than 2 watts output over the bandwidth. It consists of a three-stage amplifier and an output configuration of three 2.5-mm FETs combined to provide the high power.
(4) The output power amplifier 214 is a hybrid with 7 dB of gain and less than 1 dB of gain variation overt the bandwidth. A circulator 213 at the output prevents FET burnout at high-load VSWRs.

The T/R switch 215 uses a two section shunt mode FET switch in the receive arm to achieve greater than 33 dB of isolation at high power levels. Insertion loss is maintained at 1 dB or less over the bandwidth.
(5) In the receive loop the low noise amplifier 217 is a balanced circuit using on-chip Lange couplers at the input and output for good VSWR and low noise. A gain of 25 dB is achieved with a 1 dB compression point of +14.5 dBm.

These chips were made using the recessed gate process rather than the improved MSAG process previously mentioned. Even better performance is achieved with MSAG devices.

Figure 3A:
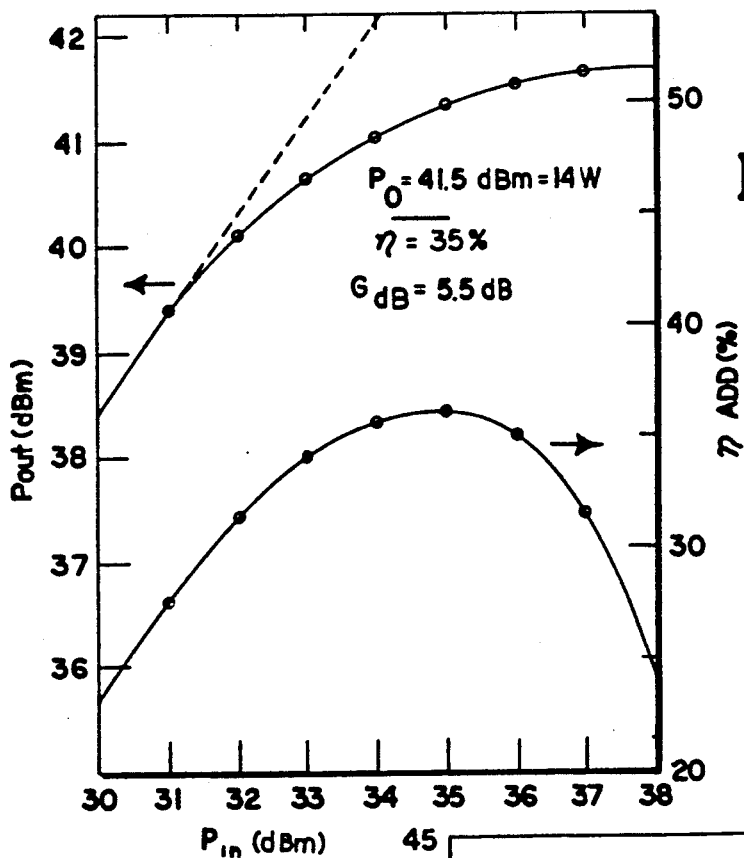
FIGS. 3a and 3b shows performance curves for a hybrid coupled MSAG amplifier.
Figure 3B:
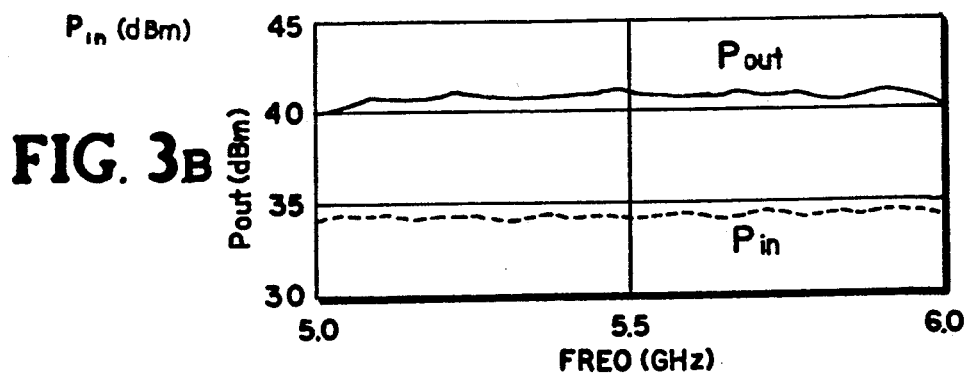

Shown in FIGS. 3A-B are performance curves for a hybrid coupled combination of four 3.5-Watt driver ICs using the MSAG process. This amplifier provides 14 Watts output with 35% power added efficiency over the 5.2-5.9 GHz frequency band, as shown in FIG. 3A. The gain is 5.5 dB. These outstanding results illustrate the improvement which will be achieved using MSAG devices. The flatness of the gain over frequency is excellent as shown in FIG. 3B. This amplifier contains 32 mm of output FET gate periphery. Because the process employed has consistently demonstrated 750 mW/mm under proper design conditions, a Final Power Amplifier approaching 20 Watts is quite possible. Since this is more power than required, the amplifier is derated thereby enhancing reliability.

Figure 4:
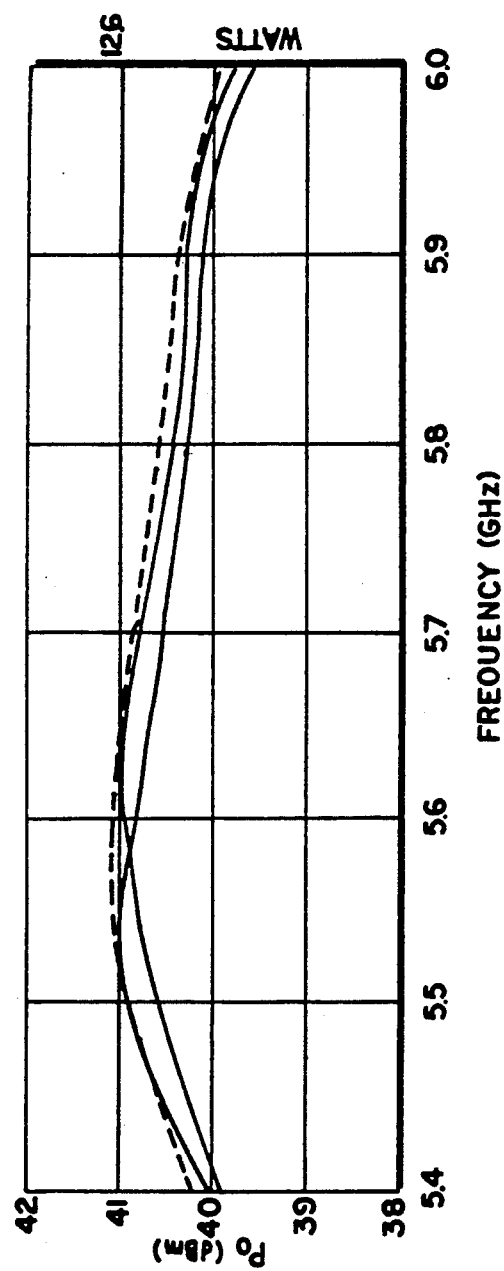
FIG. 4 shows transmit mode output power for the devices summarized in Table I.

Measurements from three T/R modules are summarized in Table I. The transmit-mode output power for the 3 modules versus frequency is shown in FIG. 4. The output power exceeds 12 Watts at 5.55 GHz. The gain flatness is good.

TABLE I

"IRAD T/R Module Measurement Summary"

| | Measured Data |
|---|---|
| Receive Mode | |
| Bandwidth (1 dB) | >600 MHz |
| Noise Figure | 5 dB |
| Gain | 25 dB |
| Gain Flatness over 50 MHz Segment | ±0.3 dB |
| Input VSWR | <1.5:1 |
| Amplitude Linearity | ±0.2 dB |
| One dB Compression Point | +12 dBm |
| 3rd Order Intercept | +23 dBm |
| Output VSWR | <1.5:1 |
| Phase Linearity over 50 MHz Segment | <5° |
| Transmit Mode | |
| Gain | 25 dB |
| Power (at module output) | 12 Watts |
| Output VSWR | ≤1.3:1 |
| Power Efficiency | 20% |
| Input VSWR | <1.5:1 |
| Pulsewidth | 0.1–200 usec |
| Duty Cycle | 30% max |
| Pulse Amplitude Droop | 0.1 dB (100 usec) |
| Intrapulse Phase | 5° |
| Input VSWR | <1.5:1 |
| Phase Shifter | 6 BIT |
| Phase Accuracy | <3° RMS 5° Peak |
| Amplitude Variation | 0.5 dB peak (0.25 dB RMS) |
| Programmable Attenuator Range | 15 dB |
| Power Supply | +12 V, −12 V |
| Power Drain | 17 Watts (25% Duty) |
| Weight | 8 oz. |
| Dimensions | 4⅛ × 1⅜ × 1" |
| Operating Temperature | −54° to +85° C. |

Figure 5:
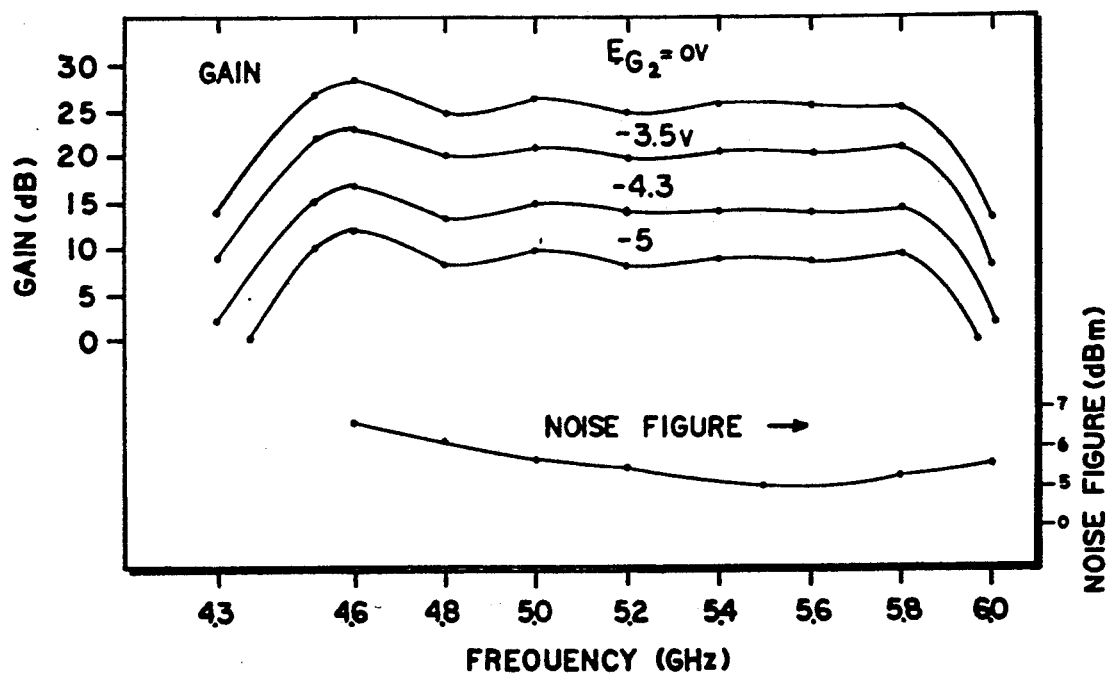
FIG. 5 illustrates T/R module receive mode passband gain and noise figures.

FIG. 5 shows the T/R module receive mode passband gain and receive noise figures. The gains is flat over the frequency band of interest.

Modules were tested over the temperature range of −55° C. to +85° C. to determine phase and amplitude variations with and without the correction circuitry. With no correction, the T/R modules receive mode shows less than 10 degrees phase and 1.5 dB gain tracking over the full temperature range of −55° C. to +85° C. The correction circuitry adjusts the phase and amplitude with temperature to set each value close to the average module slope. This corrects the gain to within 0.5 dB peak and phase to within 5 degrees peak over the operating temperature. This results in RMS phase and amplitude tracking errors of 3° and 0.25 dB, respectively.

Similarly, with no correction, the transmit mode gain is within +1.5–2 dB, while phase tracking is within 15 degrees over the operating temperature of −55° C. to 85° C. With correction the tracking errors are reduced to 0.5 dB peak amplitude and 5 degrees phase. A summary of T/R module sensitivity and tracking data is presented in Table II.

TABLE II

"T/R Module Temperature Sensitivity and Tracking"
(Over −55° C. to 85° C. Temperature Range and 600 MHz Bandwidth)

| | Uncorrected | | Corrected | |
|---|---|---|---|---|
| | Gain | Phase | Gain | Phase |
| Receive Mode | | | | |
| Sensitivity | 0.11 dB/°C. | 1.14°/°C. | | |
| Tracking | ±1.5 dB | ±10° | <0.5 dB | <5° |
| Transmit Mode | | | | |
| Sensitivity | 0.091 dB/°C. | 1.08°/°C. | | |
| Tracking | +1.5 dB, −2 dB | ±15° | <0.5 dB | <5° |

The sensitivity factors for all the GaAs circuits in the T/R module to variations in voltage from the power supply were compared with and without the internal regulators. The sensitivities are summarized in Table III. The internal regulators provide >60 dB of low frequency, (<120 Hz) rejection of input variations. With the internal power conditioner, all the DC sensitivities are reduced to negligible values. A ±10% voltage change on all bias voltages into the module produced no measurable gain or phase change in either transmit or receive mode.

TABLE III

"T/R MODULE POWER SUPPLY MEASURED SENSITIVITY"

| | UNREGULATED | | WITH POWER CONDITIONER | |
|---|---|---|---|---|
| NOMINAL VOLTAGE V | PHASE°/V | AMPLITUDE dB/V | PHASE°/V | AMPLITUDE dB/V |
| RECEIVE MODE | | | | |
| +2.5 | 60 | 10 | <0.6 | <0.1 |
| −4.0 | 26 | 1 | <0.2 | <0.01 |
| +5.0 | 2.5 | 0.25 | <0.025 | <0.025 |
| TRANSMIT MODE | | | | |
| +5 | 8.7 | 2.5 | <0.08 | <0.02 |
| −4 | 62 | 5 dB | <0.62 | <0.05 |
| +8 | 9.6 | 0.76 | <0.09 | <0.007 |
| −2.5* | 40 | 7.5 | <0.4 | <0.007 |

*(POWER FET GATE BIAS ALONE)

Figure 6:
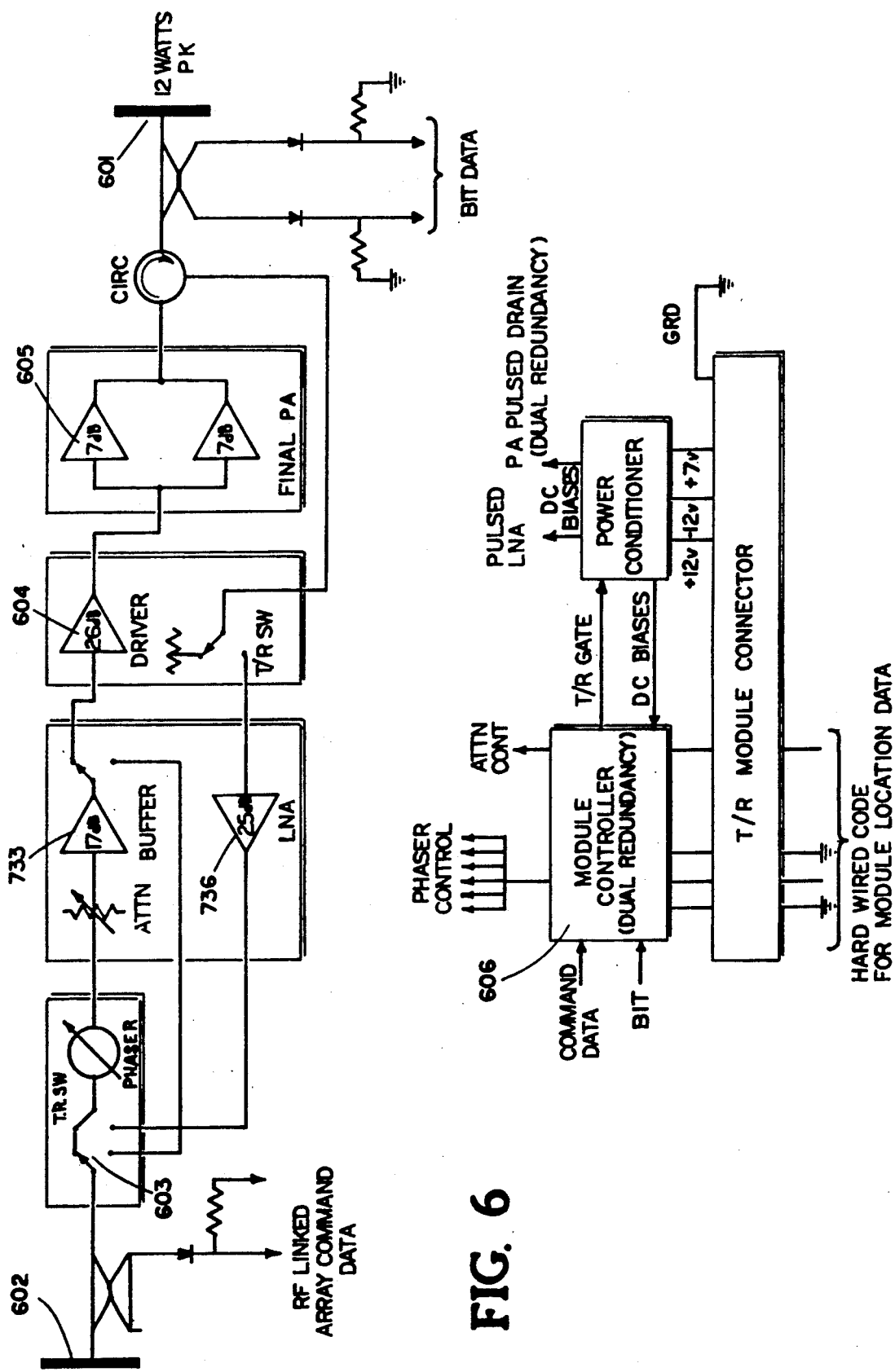
FIG. 6 illustrates in block diagram form the RF circuit topology of another embodiment.

The RF circuit topology of another embodiment of the module as shown in FIG. 6 include numerous novel features including:

Integral front and rear dipole radiating elements 601 and 602 replace RF connectors to accommodate operation as an active element in a space fed lens array.

A DPDT T/R switch 603 is provided at the rear face of the module, again to accommodate the space-lens operation.

RF circuitry for each radiating channel is partitioned into 5 MMIC chips, as shown in FIG. 6. This high level of integration is consistent with the optimum trade-off between chip yields and interconnect costs.

All of the MMICs in the module are fabricated using a single process. The drive 604 and final power amplifier 605 have been found to yield flat 14 Watt power output with 35% efficiency over the 5–6 GHz band.

The intelligent module controller 606 is implemented in ASIC (Application Specific Integrated Circuit) gate array technology. The module controller 606 permits wireless control of the array and T/R modules, as well as status monitoring and error calibration and alignment of the T/R modules.

Table IV is a summary of the performance characteristics of each RF channel in the module assembly.

TABLE IV

"T/R Module RF Performance Characteristics"

| RF Transmit Channel (each) | |
|---|---|
| Operating Frequency Band | 5.25–5.85 GHz min. |
| Gain | 32.8 dB nominal |
| RF Power Output (Radiated) | 12 Watts peak min. |
| Duty Cycle | 20% max. |
| Pulse Width | 1–200 microseconds |
| Maximum Load VSWR | Infinite (open or |

TABLE IV-continued
"T/R Module RF Performance Characteristics"

| | |
|---|---|
| | short circuit) |
| Power Amplifier Chain Frequency | 35% (DC to RF) |
| RF Receive Channel (each) | |
| Operating Frequency Band | 5.25–5.85 GHz min. |
| Gain | 25 dB nominal |
| Noise Figure (System) | 2.8 dB max. |
| 1 dB Compression Point | +10 dBm (output) |
| 3rd Order Intercept | +20 dBm |
| Input VSWR | <1.3:1 |
| Common RF Characteristics | |
| Phase Shifter | 6 bits (5 digital + 1 analog) |
| Programmable Attenuator Range | 10 dB min. |

Figure 7:
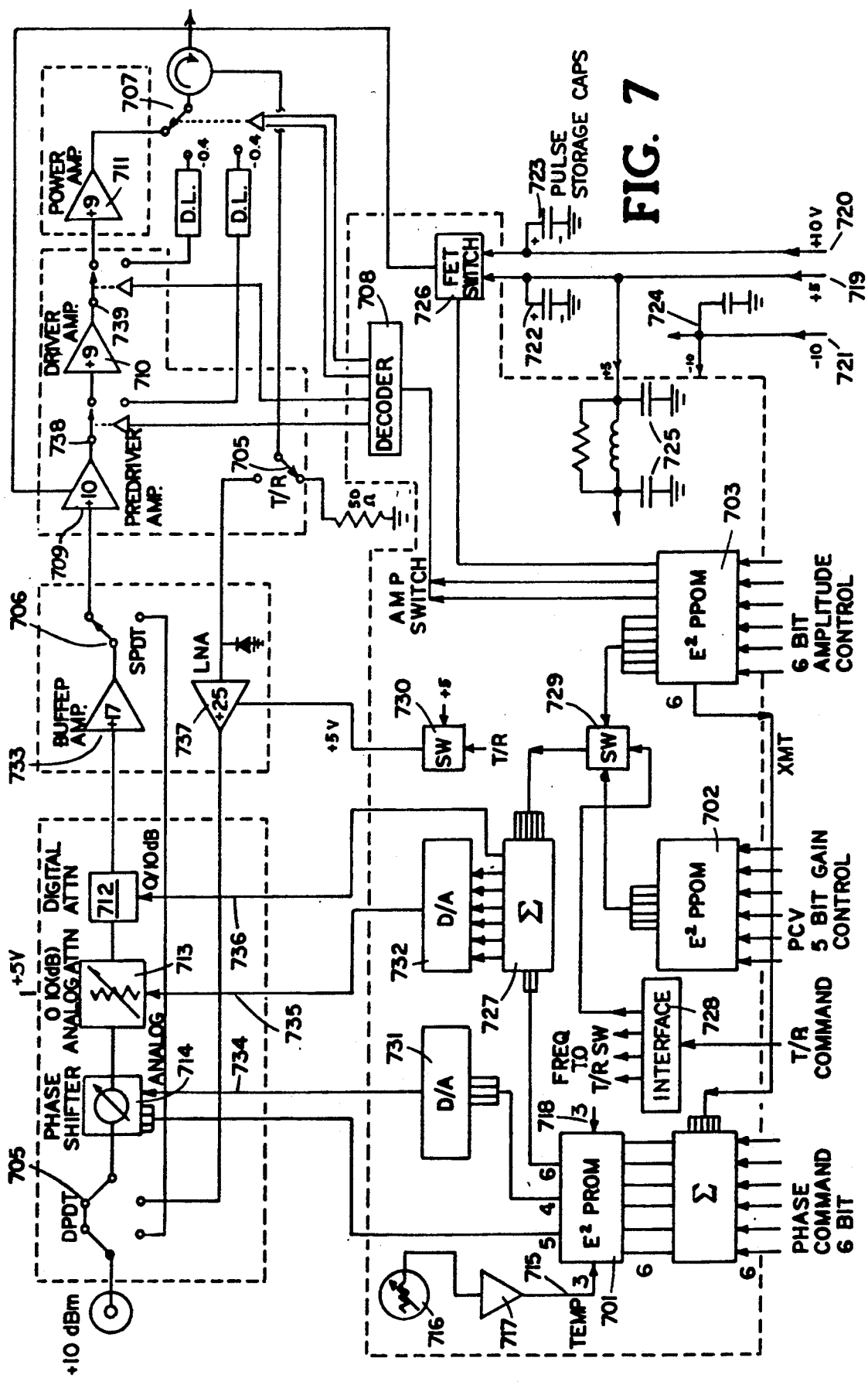
FIG. 7 is a block diagram of another embodiment of the T/R module.

FIG. 7 illustrates another embodiment of the T/R module of the invention employing four chips. Key to achieving the required phase and amplitude accuracy and tracking in the T/R module is the high uniformity of the MSAG process, and the use of simple open loop error correction in the module.

To meet the tight phase and amplitude accuracies and tracking over phase states, attenuation range, frequency, and temperature, an open-loop precalibrated configuration is used. It is the least expensive and places minimum constraints on the antenna architecture.

The detailed block diagram of the module shows how the command signals are processed in the controller to attain 3 degrees RMS phase and 0.5 dB rms amplitude precision in the module. Three EEPROMs 701, 702, and 703 are used to store corrected values of gain and phase for each of the programmed commands.

The use of GaAs chips which have high uniformity and small phase and amplitude slopes with temperature and frequency are key to meeting the unit-to-unit tracking requirement after the initial phase and amplitude errors are calibrated out by the PROMs. Precise voltage inputs to the module minimize errors due to voltage fluctuations. Measurements on GaAs chips have indicated good long-term stability of parameters after a burn-in period and make the open loop calibration approach feasible.

Figure 8:
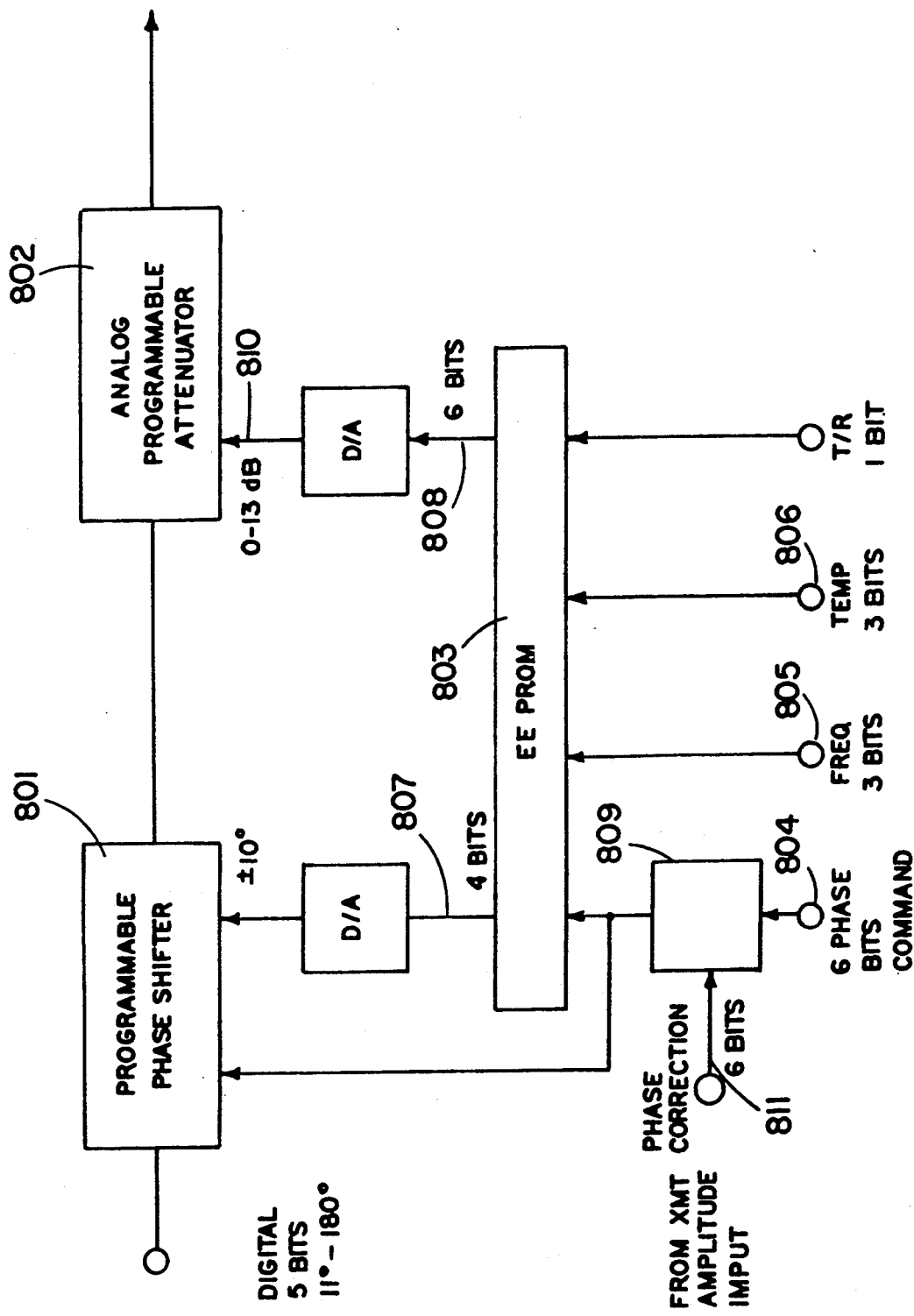
FIG. 8 is a block diagram for the amplitude and phase correction for FIG. 7.

The block diagram of the T/R module amplitude and phase correction is shown in FIG. 8. Phase corrections are produced by an analog phase bit in the phase shifter 801 to ±10 degrees, while gain is corrected in an analog programmable attenuator 802 in ±0.25 dB steps.

The input to the EEPROM 803 consists of a 13-bit phase code made up of a 6-bit phase-shift setting 804, a 3-bit frequency setting 805 and a 3-bit temperature setting 806 for both the transmit and receive modes. EEPROM 803 stows all 256 phase states for 6 frequency, 8 temperatures and for both receive and transmit modes. The EEPROM output lines are divided into 4-bit phase correction 807 (1.25 degree resolution) and a 6-bit amplitude correction 808 (0.25 dB resolution). EEPROM 803 contains all the openloop correction terms which are inputted during the calibration of the modules. The temperature corrections adjust the phase and amplitude to correspond to the average temperature sensitivity slopes so that the module-to-module tracking is improved. The frequency input adjusts for inband amplitude and phase ripple at 100 MHz intervals. A temperature sensor is located in each module controller board.

The phase bits input command signal 804 is modified by any phase corrections necessary as the transmit gain is varied in a digital summer 809. Phase corrections for the receive gain control are not necessary due to the phase accuracy and stability of the programmable attenuator 802.

The module controller accomplishes the following tasks in the module:

a) Receives a 6-bit phase command signal 804 and sets the module phase accurately. Phase corrections are applied for temperature, frequency, and phase states to maintain the required module accuracy and tracking. In addition, phase corrections are applied as the transmit gain is varied to compensate for the switching amplifiers and varying drive levels.

b) Receives a 5-bit receiver gain control command 810 and sets the gain over a 20 dB range. A correction is applied to compensate for nonlinearities of the analog attenuator 802.

c) Receives a 6-bit transmit gain control command 811 and sets the module transmit gain over a 30 dB range. A decoder throws all the power amplifier switches to set the module in the correct power output mode. The controller corrects for nonlinearities of the output amplifiers over the dynamic range.

d) Converts the output of the controller, which has a built-in temperature sensor, whose output is converted to a digital form and to a digital form and uses the output to correct phase and gain slopes of the module to improve tracking. The MOSFET switches which turn on the power amplifiers and select the drain supplies are part of the controller circuitry. Interface circuits and level shifters which provide the correct FET switch gate biases are also part of the controller.

The microwave section of FIG. 7 is composed of four circuits, three of which are completely integrated MMIC designs. The power amplifier 711 is a hybrid circuit containing four monolithic circuits with external splitters and combiners. All of the T/R 705 and power mode 706 switches are integrated in the MMIC chip design except for the output power mode SP3T switch 707. GaAs PIN diodes are used for this function to lower switching losses to a minimum, in the high power mode. Separate EEPROMs are used for the phase command 701, the receive gain command 702, and the transmit gain command 703 corrections. A decoder 708 switches the power amplifiers 709, 710 and 711 in proper fashion over the transmit attenuation command.

The programmable attenuator is made up of the 1/10 dB digital switches 712 and the 0–13 dB analog attenuator 713. This is used to set the required module attenuation, and to fine adjust the gain variations of the programmable phase shifter 714 over all states, temperature and frequency. A buffer amplifier 733 is connected between digital attenuator 712 and switch 706.

The phase control EEPROM 701 accepts 3 bits of temperature 715 from an onboard thermistor 716 - A/D circuit 717. Three bits of frequency control 718 are also inputted to provide corrections over the operating band of 600 mHz. The controller also contains level translators which set the voltage input to the MMIC circuits at the proper level for operation.

The incoming voltages of +5V provided on conductor 719, +10V provided on conductor 720 and −10V provided on conductor 721 are filtered by filters 722, 723, and 724, respectively, and held during pulsing with large storage capacitors a multiple MOSFET arrangement which switches the drain voltages between +10V, +5V or 0 volts. Separate drain control allows turning off amplifiers not used and reducing the class B idling currents to 0. Class B amplification is employed to increase efficiency and lower temperatures.

Commands are directed through interface 728 to switch a switch 729 between EEPROMs 702 and 703 and to switch T/R switches 705 and 706 and LNA switch 730. Digital to analog converters 731 and 732 convert outputs from EEPROM 701 to the analog input 734 of phase shifter 714 and through summer 727, which has the output of switch 729 as its other input, to the analog input 735 of attenuator 713. A digital output 736 from summer 727 goes to digital attenuator 712.

Figure 9:
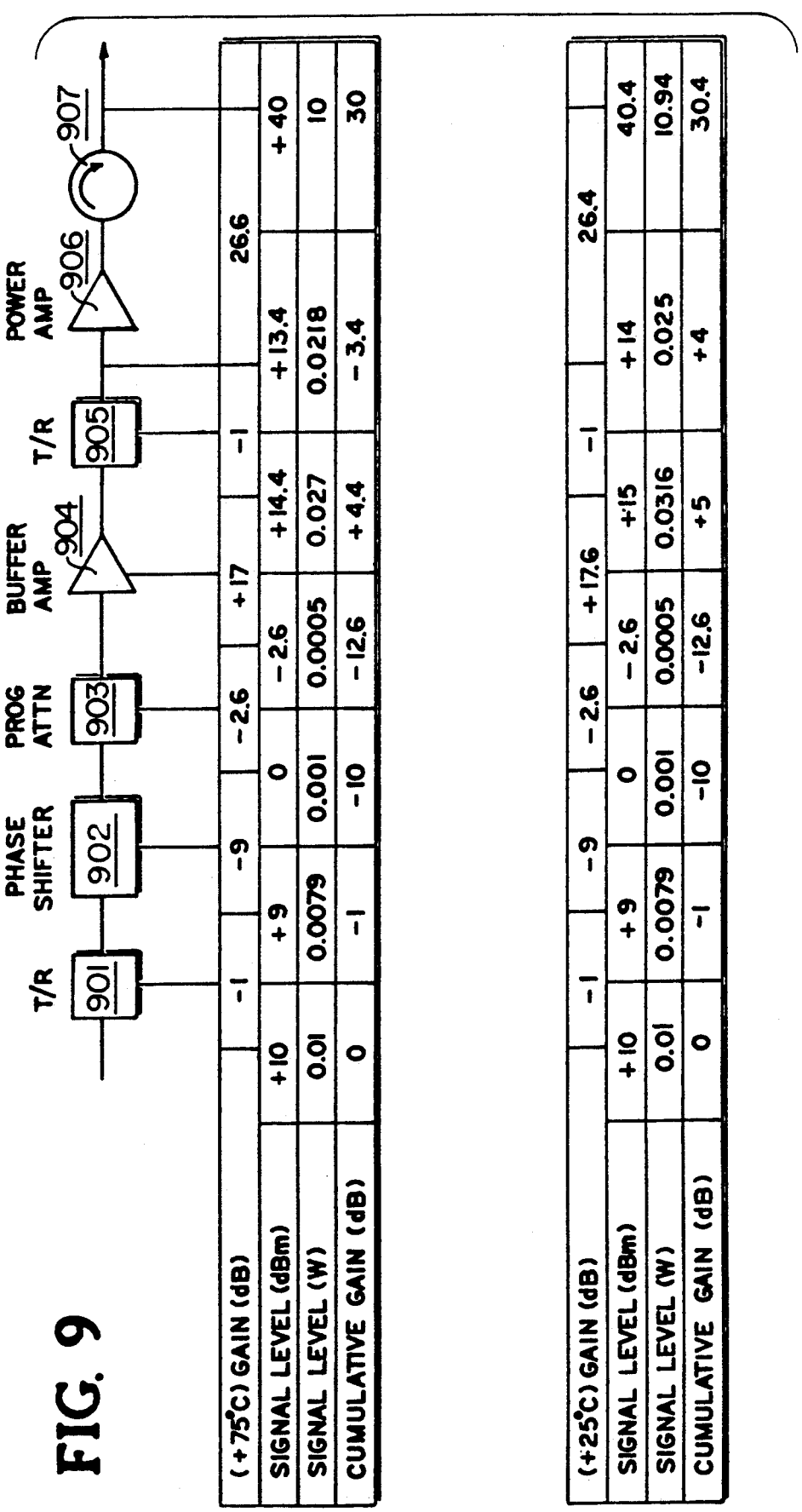
FIG. 9 illustrates the transmit mode signal level and gain distributions for the high power mode.
Figure 10:
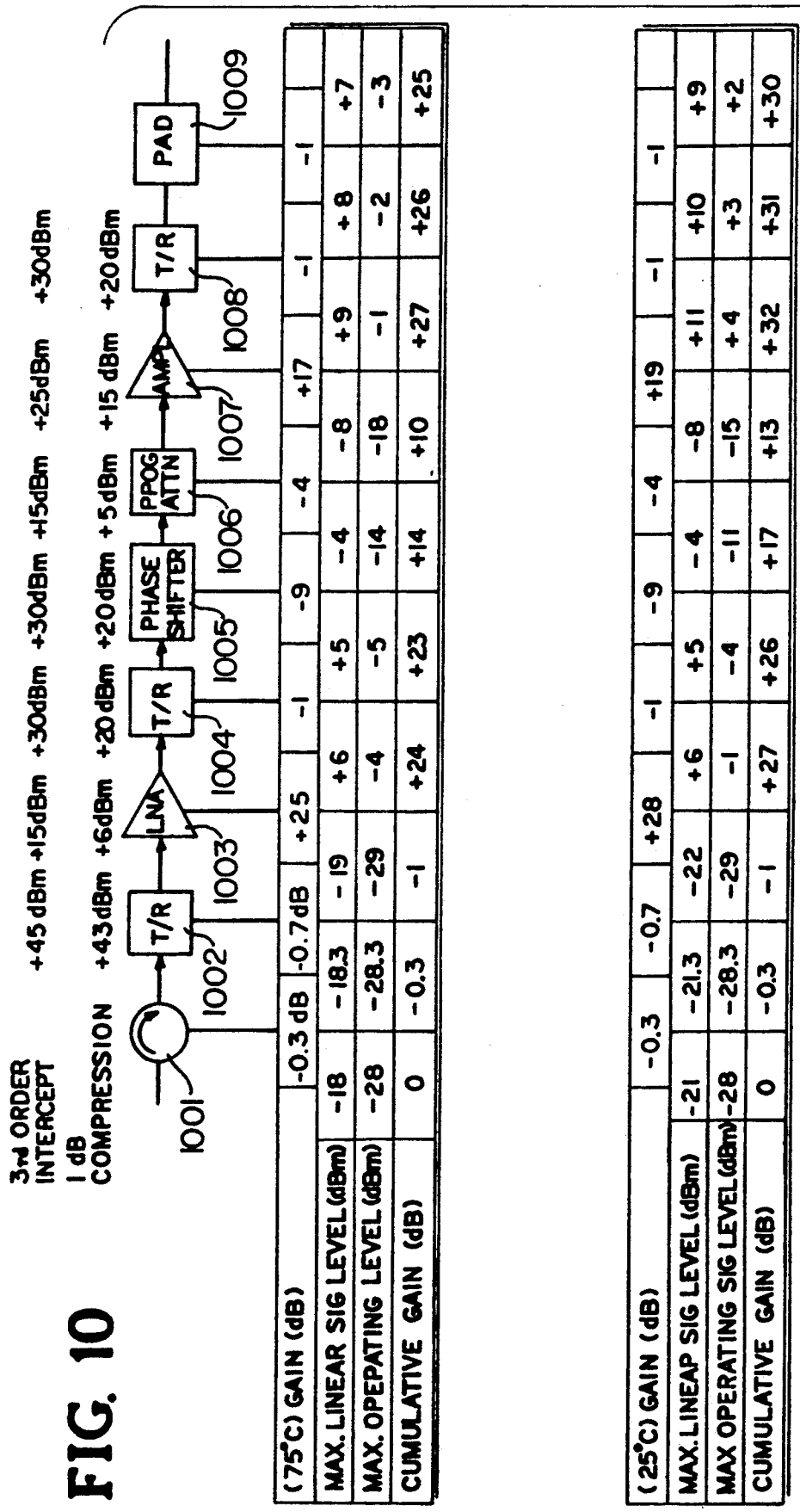
FIG. 10 illustrates the same for the receive mode.

The receive channel elements are positioned to optimize the overall noise figure and dynamic range over the operating temperature. The gain and level diagram in FIG. 9 shows the signal levels encountered down the receive path at 25° C. and 75° C. The total receive gain is 25 dB at 75° C. and increases to 30 dB at room temperature. These gain changes are due to the FET stages in the amplifier chain and correspond to a nominal gain versus temp slope of 0.016 dB/° C. per stage. The modules are expected to track gain over temperature very closely and open loop corrections will be applied to bring each module gain versus temperature slope to the nominal value. Two input signal levels are shown in FIG. 10: −28 dBm, which is the maximum anticipated operating level, and −21 dBm, the maximum linear level. The noise figure requirements of the module are met using an input preamp with a 2 dB noise figure at 25° C. The calculations shown in FIG. 11 take into account 1.25 dB of input losses and gives 3.2 dB module noise figure at 25° C. and 3.8 dB at 75° C.

The 1 dB compression point of all the active microwave components are given in FIG. 10, along with the signal levels encountered for the maximum operating signal levels. All listed signals are greater than 5 dB below compression so that excellent amplitude and phase linearity are achieved.

Figure 11:
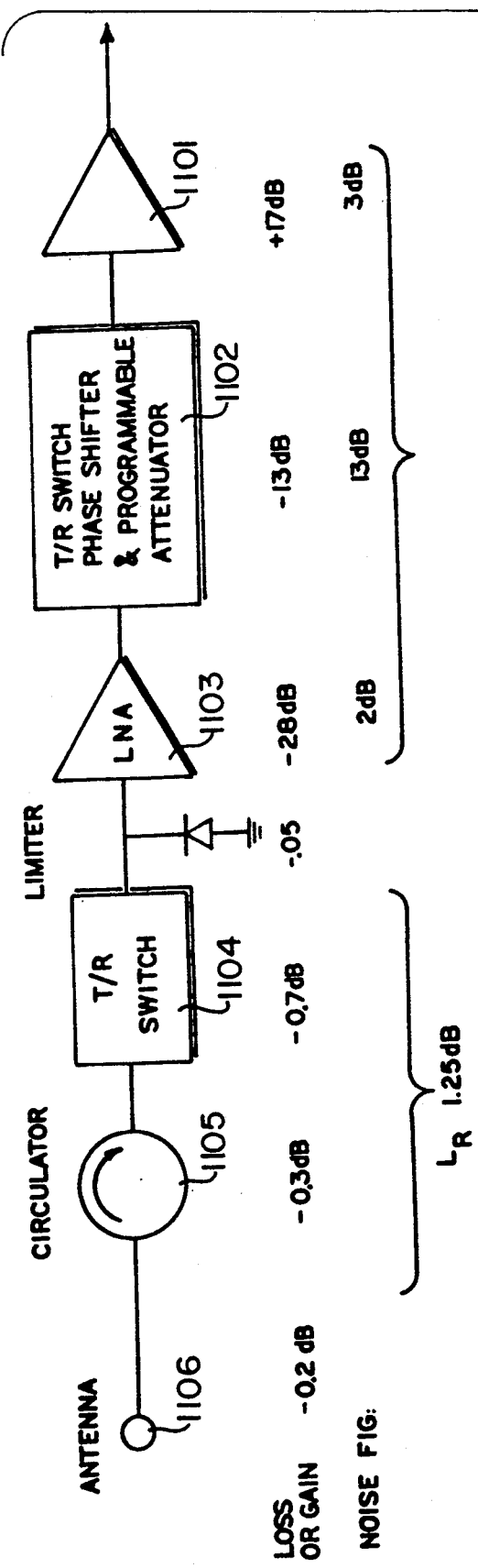
FIG. 11 illustrates the T/R modules noise figure calculation and receive loss.

The instantaneous dynamic range of the receiver is calculated in FIG. 11, using a 4 dB noise figure and 100 MHz bandwidth. A 69 dB dynamic range is obtained with a maximum output signal level of 9 dBm at 25° C. At 75° C. a 67 dB dynamic range is obtained with a maximum output signal level of 7 dBm.

The use of broadband monolithic components in the transceiver results in excellent phase linearity and low amplitude ripple over the operating bandwidth. Measurements on our existing GaAs monolithic C-band amplifiers show less than 0.2 dB amplitude ripple and 2 degrees phase linearity over 200 MHz.

The transmit output power is held above 10 watts (+40 dBm) and the overall maximum gain maintained above 30 dB for all operating environments.

The transmit level distribution chart in FIG. 9 shows the signal levels and gains along the transmit path for 25° C. and 75° C. operating temperatures. The nominal gain changes with temperature are based on measured or estimated values of gain versus temperature sensitivity and changes in drive levels for the power stages. At 25° C. the buffer amp 904 is into one dB compression as is the power output amplifier 906. 10.94 watts of output power is achieved with an overall gain of 30.4 dB. At +75° C. all the amplifiers are below one dB compression giving 10 watts with an overall gain of 30 dB.

Both harmonic and nonharmonic spurious frequencies are maintained at a low level at the transmitter output. Measurements of single-ended class B power amplifiers give 40 dB suppression of harmonics, due to the DC bias feed quarter wavelength line and the matching networks. Additional suppression in the output isolator will further reduce this figure.

The power amplifiers are designed to be stable and exhibit no spurious modes when pulsed. The operating voltages are kept below the avalanche points, and the power supply leads are well filtered to prevent regeneration.

Discrete nonharmonic spurious signals have been measured in the pulsed and CW class B mode of power FETs and have been found to be below 65 dB down.

Measured performance of GaAs FETs operating in the class B mode shows superior characteristics, with high efficiency, constant gain, and good phase characteristics over 7 dB dynamic range.

To determine the feasibility of class B operation of GaAs FETs, measurements were made at C-band with both pulsed and CW inputs on several devices and circuits.

The devices tested were the GTC AlGaAs 2.5 mm power FET, a power amplifier MMIC circuit which uses three standard power FETs (GTC 227-1) and an internally matched power FET manufactured by Fujitsu (FLM 5359-14).

All of these amplifiers were tested in a single-ended configuration and in a class B mode.

The characteristics which are important for application as a variable power element in a T/R module were measured. These include linearity of power output versus power input, the power-added efficiency, the transmission phase change versus input power, and the operation at reduced drain voltages. Pulsed measurements were made to determine the turn-on, turn-off characteristics of the class B amplifiers. Phase runout during the pulse (intrapulse phase change) and phase change between pulses (interpulse phase change) were measured. Similarly, intrapulse amplitude droop and interpulse amplitude change were noted. For good MTI performance, it is important that these pulse amplitude and phase changes be low and not exhibit erratic behavior. The gain and phase sensitivity to drain voltage during the pulse mode was also measured. Spectrum analysis on the pulsed and CW modes were made to determine spurious levels.

The GTC 2.5 mm AlGaAs power FET has good characteristics for class B operation. These include low pinchoff voltage of 2 V, high drain breakdown voltage of 30 V and high gain.

The GTC 2.5 mm FET was biased at −2 V, which is just below pinchoff, so that a 0.1 mA quiescent drain current was established.

Figure 12:
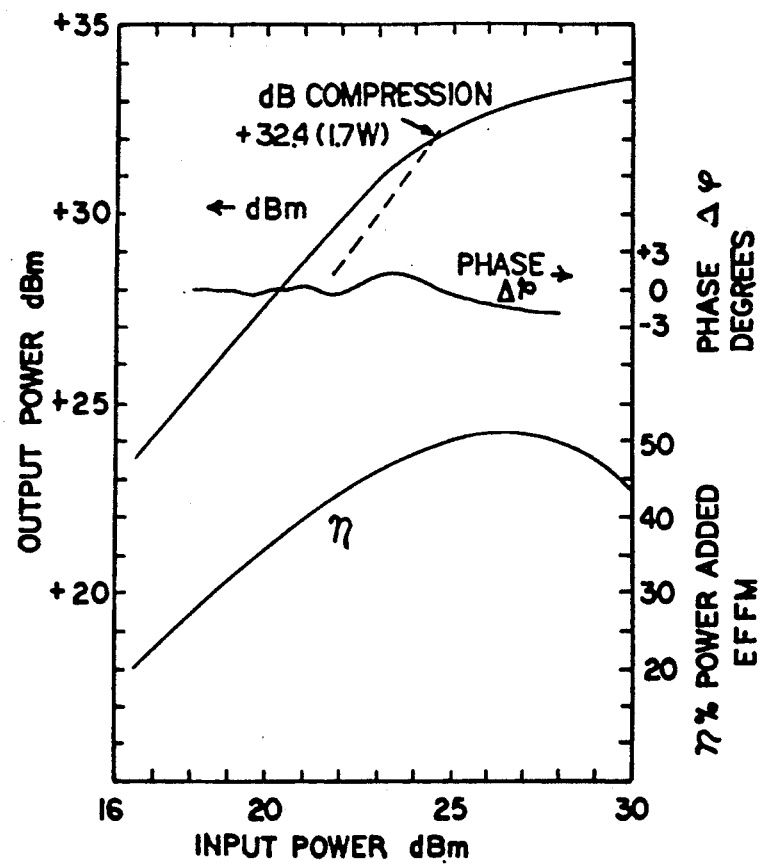
FIG. 12 is a graph of efficiency and power output versus power input for class B operation of the amplifier.

The power-added efficiency and power output versus input power curves are plotted in FIG. 12. A fairly constant gain of 7.5 dB was obtained up to the one dB compression point, which occurs at (+32.4 dBm) 1.7 W output. The power-added efficiency peaked at 50.7% at this point. Operating from the one dB compression point down to +25.4 dBm (0.346 W), the efficiency stays above 25%.

The gate current was monitored over the input drive range, and it approaches 20 mA at the one dB compression point. For the ten-fingered device, this is near the maximum allowable finger gate current of 2 mA for reliable operation.

The transmission phase change of 10 dB of range was less the±1.5 degrees, up to the one dB compression point.

Figure 13:
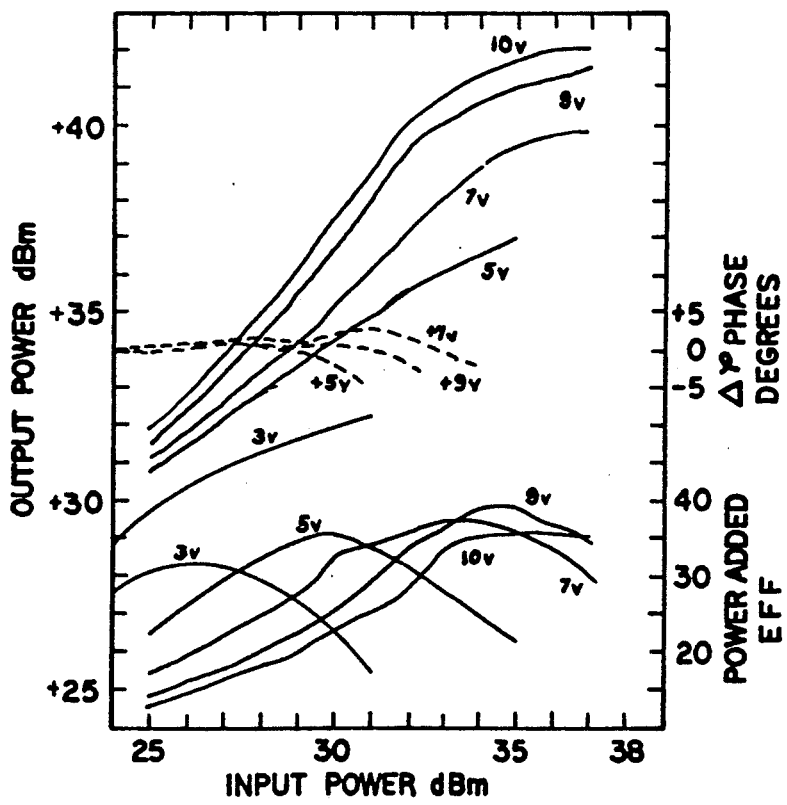
FIG. 13 is a graph of efficiency and power output versus power input at different biases for class B.

Similar type measurements were made on the Fujitsu FLM 5359-14 C-band power FET and the results are give in FIG. 13. This internally matched power FET is a hybrid device with a 2 V pinchoff and a 30 V breakdown.

Efficiency, power output and phase shifter versus input power level were recorded for drain voltages of +10 V, +9 V, +7 V, +5 V and +3 V.

The gain is constant over a wide, dynamic range for each operating voltage. The gain drops from 7.5 dB at +10 V to 6.0 dB at +5 V. The power output at one dB compression is 16.3 watts (+42.14 dBm) at +10 V and 3.88 watts (+35.88 dBm) at +5 V.

The graph of transmission phase change Δ versus power output is plotted from low-level input up to the one dB compression point from +10 V, +7 V, and +5 V operation. Less than ±1.5 degrees phase shift occurs for all of these operating voltages.

The peak power efficiencies remain above 35% for all of these voltages in the range of 10 V to 5 V.

Figure 14:
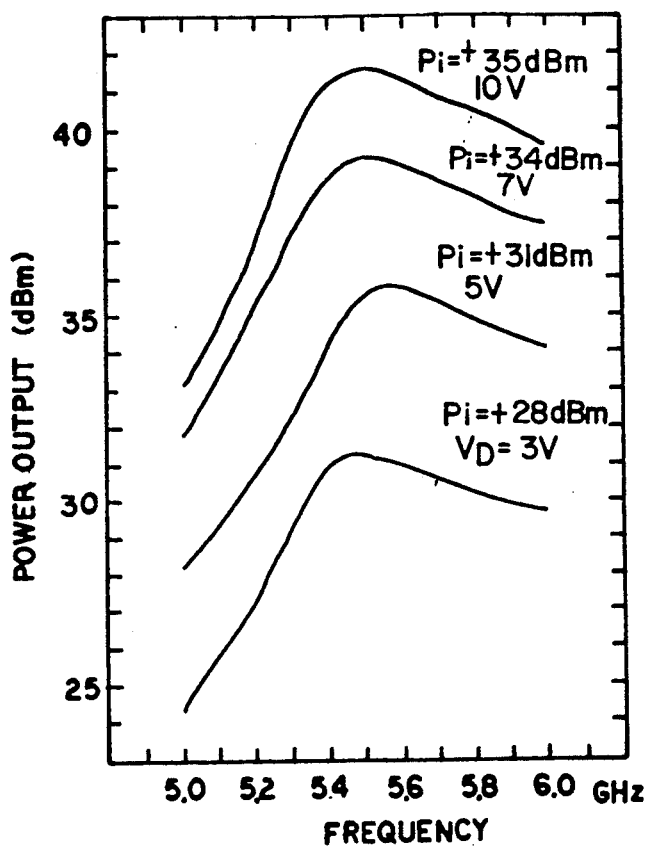
FIG. 14 is a graph of power output versus frequency at different drain voltages and drives for class B.

The graph of power output over frequency characteristics at different drain voltages is plotted in FIG. 14. From 5.3 to 5.9 GHz, the band-pass curves remain similar as the supply voltage is changed from +10 V to +3 V.

Because of a very low knee voltage, this FET exhibits acceptable performance when operating with a +3 V drain supply.

Tests on an MMIC power amplifier using MSAG devices were performed. The pinchoff voltage for the FETs is −4.61 volts, the knee is about +2.6 V and the drain breakdown voltage is 18 volts.

Figure 15:
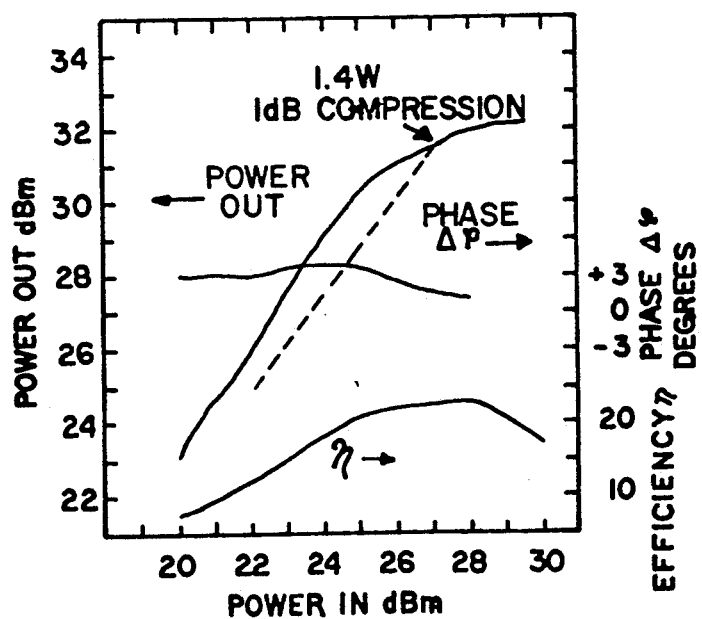
FIG. 15 is a graph of power output and efficiency versus power input for class B.

Performance of this amplifier in a class B mode is shown in the curve of FIG. 15. Linear gain of 4 dB is obtained up to the one dB compression point of 1.4 watts (+31.46 dBm). The power-added efficiency peaks at 23% and decreases smoothly to 10% when the power drops 7 dB. The low gain and high pinchoff and knee voltages are responsible for the low efficiencies. The drain efficiency of this device is near 39%. Inserting the AlGaAs FETs in this circuit will increase the efficiency above 50% and the gain to 7.5 dB, with power outputs to 3 watts.

The graph of phase shift versus power input curve gives good results of less than 2 degrees over the dynamic range.

Pulsed measurements of the power amplifiers were taken to determine on-off characteristics in class B operation, and to measure transient phase and amplitude effects.

Class B power amplifiers exhibit excellent linearity, efficiency and pulse behavior over a wide range of power output levels. Spurious levels are below 65 dB over the 10 dB dynamic range.

This T/R module employs a total of 4 GaAs chips, 3 of which are completely multifunctional and fully integrated. Table V lists the chips and some of their characteristics.

The chip sets use the MSAG process for superior performance and improved reliability. These chips are single substrate multifunction circuits containing via holes, internal biasing resistors and interconnections.

TABLE V
List of Chips

| Chip No. | Functions | Chip Size mm² | Total FET Gate Periphery |
|---|---|---|---|
| 1 | Programmable phase shifter | (5 × 5 mm) | 50.1 mm |
|   | Analog Attenuator | 25 |   |
|   | DTPD Switch |   |   |
| 2 | Low Noise Amp. | (4.1 × 4.4 mm) | 11.8 mm |
|   | Buffer Amp. SPDT Switch | 18 |   |
| 3 | Predriver AMP | 6 × 6 mm | 47 mm |
|   | Driver Amp | 36 |   |
|   | 2 SPDT switches |   |   |
|   | High Power T/R Switch |   |   |
| 4 | Power Amplifier | 4 × 4 mm | 20 mm |
|   | 4 Chip-Hybrid | 16 (each chip) |   |

Chip #1 consists of a low power DPDT switch 705, a programmable phase shifter 714, a digital 1-bit programmable attenuator 712, and an analog attenuator 713.

The DPDT switch 705 is simply two SPST (same as Chip #2) series-shunt switches in cascade. The 1-bit programmable 0/10 dB step attenuator uses two SPST 600 μm FET switches with a fixed resistor pad.

The phase shifter 714 is a precision 6-bit (5 digital +1 analog) MMIC design. The MMIC chip configuration and its measured performance demonstrated outstanding phase accuracy over frequency, temperature and phase bit setting as well as low insertion loss and low insertion loss variation. This has the best performance of any other MMIC phaser reported.

The programmable phase shifter 714 is a key element of the transceiver in maintaining phase accuracy and amplitude stability as well as unit-to-unit tracking. This phase shifter 714 will meet the overall T/R module system requirements when combined with an open loop error compensation and corrector circuit. The corrections are applied to the analog phase correction bit 734 and to the programmable attenuator 713. The phase shifter consists of five digital bits and an analog bit. The sixth bit resolution of 5.6 degrees is accomplished using the analog bit control. This is also used to correct for phase shifter errors as well as other external errors. A ±10 degrees phase adjustment range of this bit allows complete compensation for the worst case phase error over all bits with frequency and temperature.

The phase shifter 714 is composed of six cascaded stages. The 11.25°, 22.5° and 45 bits consist of loaded line sections, while the 90° and 180° bits use Lange couplers for reflection type phase shifters. The latter use Lange couplers designed for 12 μm line widths and gaps, and an overall length of 4.96 mm. A 2400 μm FET switch terminates a transmission line matching network, which produces reflected incoming signals with the required 90° phase shift. The FET size for each bit was optimized for best VSWR and insertion loss, resulting in three different FET peripheries in the circuit: 1200 μm, 1800 μm, and 2400 μm.

These large FETs also give rise to higher power handling capability.

The analog bit consists of 22 degrees range which uses FETs in a variable impedance mode to adjust the phase shift over ±10°. The loaded line sections consist of approximate quarter wave long transmission lines of about 50 ohms, loaded at both ends with high impedance stubs terminated with the FET switches. The measured performance of the phase shifter is summarized in Table VI.

TABLE VI
Programmable Phase Measured Shifter Performance

| | |
|---|---|
| Operating Frequency | 5.0–6.0 GHz |
| Digital Bits | 180°, 90° |
| | 45°, 22.5° |
| | 11.25° |
| Analog Bits | ±10° |
| Phase Accuracy | 5° RMS over Bits, Freq. and Temp. |
| Insertion Loss | 7 dB Max. |
| Loss Variation Over Bits, Frequency & Temp. | ±0.5 dB |
| Switching Time | 0.2 μsec |
| Analog Bit Adjustment Range | ±10° |
| Insertion Loss Variation Over Phase | ±0.2 dB Peak |
| Control Voltage | 0 to −3 V |
| Phase Stability | ±1° |
| In-Out VSWR | ≦1.4:1 |
| 1 dB Compression Point | +20 dBm |
| 3rd Order Intercept Point | +30 dBm |

The analog programmable attenuator 713 is used to adjust the gain of the T/R module over a 10 dB range and to compensate for gain changes (3 dB) due to phase setting, frequency and temperature, and reduces sensitivity to less than 1 degree per 6 dB of gain adjustment for increased system accuracy. This is accomplished by using both gates of the dual-gate device for control. Performance is as shown in Table VII.

TABLE VII
Programmable Attenuation Performance

| | |
|---|---|
| Operating Frequency | 5.0–6.0 GHz |
| Gain Control | Analog |
| Gain Adjustment Range | 13 dB |
| Insertion Loss | 3 dB Max. |
| Noise Figure (Max. Gain) | 5 dB |
| Phase Variation Over 10 dB Attenuation | ±1° |
| Amplitude Stability Over Temp. & Freq. | ±0.2 dB |
| 1 dB Compression Point | +5 dBm |
| Third Order Intercept Point | +15 dBm |
| Gain Control Switching Time | ±0.2 μsec |
| Input VSWR | <1.4:1 |
| Output VSWR | <1.4:1 |
| Power | +5 V at 10 mA |
| | −4 V at 1 mA |

Figure 16:
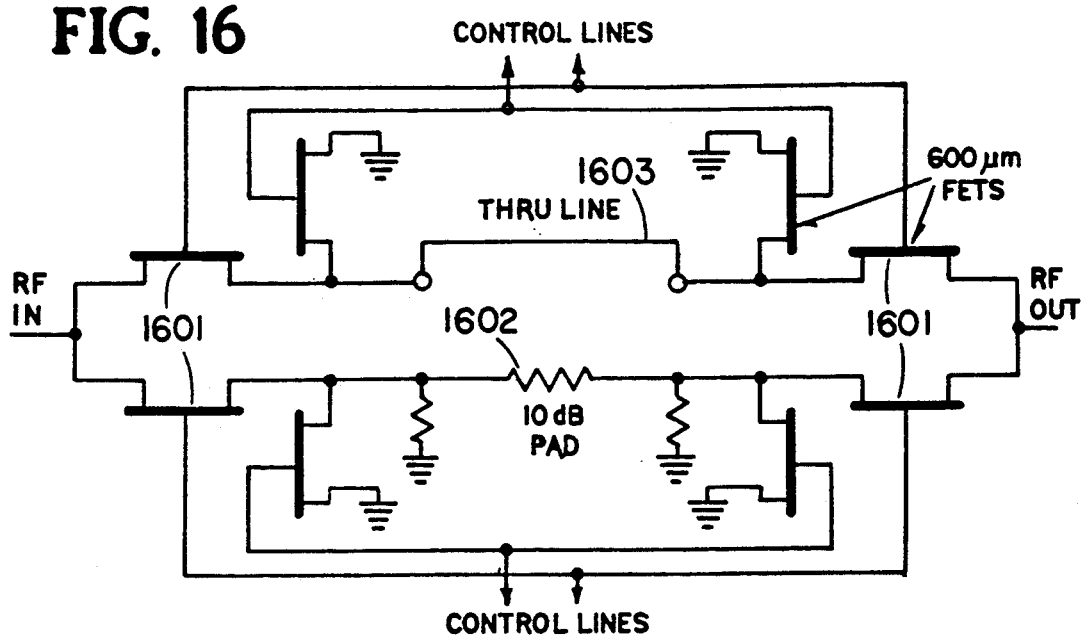
FIG. 16 is a schematic of the 10 dB step attenuator 712 of FIG. 7.

The one-bit 0/10 dB digital attenuator 712 is used to provide a fixed 10 dB step of gain change to the module. This design utilizes DPDT switches 1601 developed with a fixed resistance pad 1602 as shown in FIG. 16. The thru lien 1603 is phase matched in length for <1° phase change over the 10 dB switch range. To minimize the size, 600 μm FETs are used for the switches since absolute loss is not critical in this circuit.

TABLE VIII
1/10 Step Attenuator Performance

| | |
|---|---|
| Operating Frequency | 5.0–6.0 GHz |
| Attenuation | 0 or 10 dB |
| Attenuation Accuracy | ±.5 dB |
| Differential Phase Shift | ±1° |
| Fixed Loss | 2 dB Max |
| Switching Time | <0.2 μsec |
| Input VSWR | <1.4:1 |
| Output VSWR | <1.4:1 |
| One dB Compression | +10 dBm |
| Max Power Input | +20 dBm |
| Command | 0 to −3 V |

TABLE VIII-continued
1/10 Step Attenuator Performance

| | |
|---|---|
| High Impedance | — |

The DPDT T/R switch 705 must handle at least +10 dBm and have high isolation to prevent crosstalk. Two SPST switches using 2.5 mm FETs in series-shunt configuration are used to implement a compact circuit.

The performance of the switch is given in Table IX.

TABLE IX
DPDT T/R Switch Performance

| | |
|---|---|
| Operating Frequency | 5.0–6.0 GHz |
| Max Power Input (CW) | 100 mW (+20 dBm) |
| Insertion Loss | 1 dB |
| Isolation | ≧40 dB |
| Switching Time | ≦0.2 μsec |
| Input VSWR | <1.4:1 |
| Output VSWR | <1.4:1 |

Chip #2 contains a three stage LNA 737, a two stage buffer amplifier 733 and a SPDT switch 706 integrated on a single chip measuring 4100 μm×4400 μm. The preamplifier 737 contains three 0.8 μm×300 μm GaAs FETs while the buffer amplifier 733 has a 0.8 μm×300 μm and a 0.8 μm×600 μm FET. The SPDT switch 706 contains four 2.5 mm FETs in a series-shunt configuration.

The receiver LNA 737 and buffer amplifier 733 are low noise amplifiers utilizing the new MSAG ultra-low-noise FETs to achieve a 2 dB noise figure and high gain and dynamic range.

The amplifiers are designed to meet the required overall system dynamic range of 60 dB and noise figure of 2.8 dB. Two amplifiers are used: a low-noise preamplifier 737 with a low-noise, low-input VSWR, 25 dB gain stage for the receiver input, and a buffer amplifier 733 with 17 dB gain and high dynamic range used in both the receive and transmit modes. The input amplifier maintains system linearity over a wide dynamic range by having a 1 dB compression point of +6 dBm. The low-noise preamplifier 737 uses a three stage, single-ended configuration and the buffer amplifier 733 uses a two state cascaded amplifier arrangement to meet these requirements.

The performance for these amplifiers and the switch is shown in Tables X, XI and XII. An external PIN diode limiter is used to prevent damage with +20 dBm CW input.

TABLE X
LNA Performance

| | |
|---|---|
| Operating Frequency | 5.0–6.0 GHz |
| Nominal Gain (75° C.) | 25 dB |
| Gain Flatness Over 100 MHz Bandwidth | ±0.2 dB |
| Input VSWR | ≦1.4:1 |
| Output VSWR | ≦1.4:1 |
| Noise Figure at 75° C. | 2 dB Max |
| 1 dB Compression Point | ≧+5 dBm |
| 3rd Order Intercept Point | ≧+15 dBm |
| Phase Linearity Over 100 MHz B.W. | ±2° |
| Amplitude Linearity 100 MHz B.W. | ±0.1 dB |
| Bias | 5 V at 25 mA and |
| | −4 V at 1 mA |
| Input CW Level, No Damage | +15 dBm |

TABLE XI

Buffer Amplifier Performance

| | |
|---|---|
| Operating Frequency | 5.0–6.0 GHz |
| Nominal Gain (75° C.) | 17 dB |
| Gain Flatness Over 100 MHz Bandwidth | ±0.2 dB |
| Input VSWR | <1.5:1 |
| Output VSWR | <1.5:1 |
| Noise Figure at 75° C. | ≦3.0 dB Max |
| 1 dB Compression Point | +15 dBm |
| 3rd Order Intercept Point | +25 dBm |
| Phase Linearity Over 100 MHz B.W. | ±2° |
| Amplitude Linearity 100 MHz B.W. | ±0.1 dB |
| Bias | 5 V at 30 mA and −4 V at 1 mA |

TABLE XII

SPDT-T/R Switch Performance

| | |
|---|---|
| Operating Frequency | 5.0–6.0 GHz |
| Switch Configuration | SPDT |
| Max Power Input (CW) | 100 mW (+20 dBm) |
| Insertion Loss | ≦1 dB |
| Isolation | ±30 dB |
| Switching Time | ≦0.2 μsec |
| Input VSWR | <1.4:1 |
| Output VSWR | <1.4:1 |
| Command | |
| On | 0 V |
| Off | −3 V |

Chip #3 contains the high power T/R switch 705, the predriver 709, driver amplifier chain 710 and 2 SPST switches 738 and 739. The SPST switches 738 and 739 are similar to those in Chips #1 and #2 but have a high power level. The output switch 739 uses 4 mm FETs so as to handle 2 watts of power.

The predriver 709 and driver 710 amps are class B circuits which deliver 240 mW and 1.7 W, respectively.

The predriver amplifier 709 consists of a 600 mm FET biased for class B operation. The FET has a low pinchoff voltage of −1.5 V and a class B gain of >10 dB. The performance of the amplifier is given in Table XIII.

TABLE XIII

Predriver Amplifier Performance

| | |
|---|---|
| Operating Frequency | 5.0–6.0 GHz |
| Operating Mode | Class B |
| Power Out (1 dB Compression) | 250 mW |
| Gain | 10 dB min |
| Power Added Efficiency | 67% |
| Operating Drain Voltage | +10 V |
| Input VSWR | <1.4:1 |
| Output VSWR | <1.4:1 |

The driver amplifier 710 consists of a 2.5 mm FET producing 1.7 watts of power. This amplifier is used for the output stage in the medium power mode of the T/R module. The performance is given in Table XIV.

TABLE XIV

Driver Amplifier Performance

| | |
|---|---|
| Operating Frequency | 5.0–6.0 GHz |
| Operating Mode | Class B |
| Power Out (1 dB Compression, +10 V Drain) | 1.7 Watts |
| Gain | 9 dB |
| Power Added Efficiency | 67% |
| Operating Drain Voltage | +5 V to +10 V |
| Input VSWR | <1.4:1 |
| Output VSWR | <1.4:4 |

Figure 17:
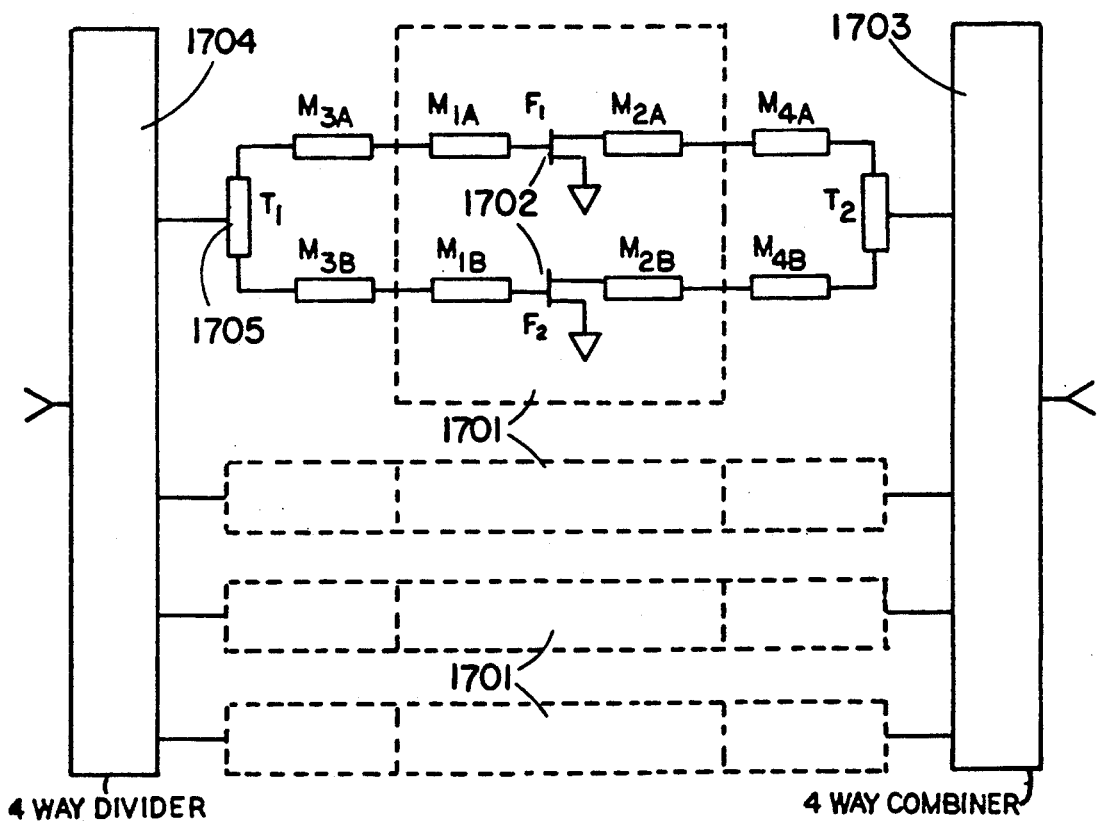
FIG. 17 is a diagram partly in block and partly schematic of the power amplifier 711 of FIG. 7.

Chip #4 is a hybrid circuit containing four 3.2 Watt amplifier discrete MMIC chips 1701 combined on a high dielectric microwave substrate. See FIG. 17. This makes up power amplifier 711.

Each MMIC chip amplifier 1701 contains two 2.5 mm FETs 1702 operating class B in a push-pull circuit configuration. Each MMIC chip can produce 3.2 Watts of power at the one dB compression point while operating at +10 V drain voltage. Four way combining in 1703 produces about 12 Watts of total power.

The performance of the power amplifier 711 is given in Table XV.

TABLE XV

| | |
|---|---|
| Operating Frequency | 5.0–6.0 GHz |
| Operating Mode | Class B |
| Power Out (1 dB Compression) +10 V Drain | 12 Watts |
| Gain | 9 dB |
| Power Added Efficiency | 67% |
| Operating Drain Voltage | +5 V to +10 V |
| Input VSWR | <1.4:1 |
| Output VSWR | <1.4:1 |

The entire 12-Watt amplifier has very high density packaging. The input and output substrates and single-chip GaAs FET are mounted in a 0.5"×1.5" metal container, which has an excellent heat sink in a hermetically sealed environment.

The input section has a four-way power splitter 1704, four baluns to feed the four pairs of 2.5 mm GaAs FETs and four simple impedance transformers 1705. The output section is a replica of the input to collect the total output power. The balun design is a standard coplanar circuit with a modification for small size.

Each coarse transmit output power level of the module can be selected rapidly and maintained with low-power loss by incorporating a high-efficiency RF power switch.

The coarse control of the module transmit output power level is achieved with a single-pole, three-throw RF switch 707. The insertion loss associated with each switch position will be minimized since this will reduce the total module output power. The first switch position handles RF output levels from 1 Watt to 10 Watts and the overall efficiency is one of the most critical requirements.

The tradeoff considerations in switch design put emphasis on low loss at Level 1 position and a compromise for second and third level. The electrical characteristics for the selected candidate are shown in Table XVI.

TABLE XVI

RF Switch Characteristics

| Transmit Mode | Insertion Loss | Isolation |
|---|---|---|
| High Power | <0.1 dB | >50 dB |
| Medium Power | <0.3 dB | >28 dB |
| Low Power | <0.3 dB | >28 dB |

Figure 18:
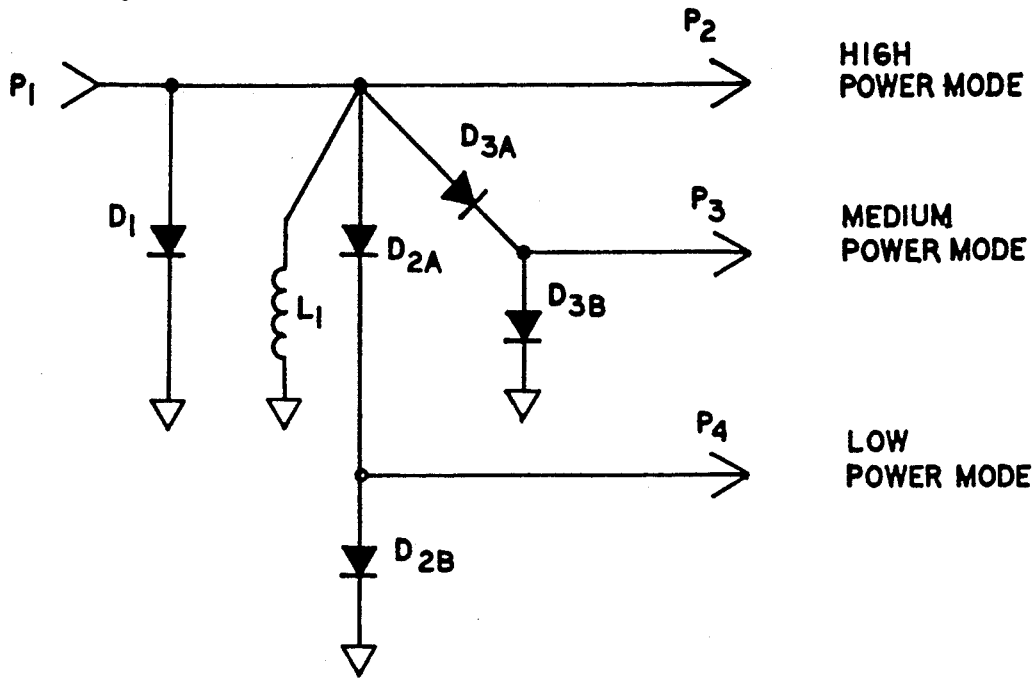
FIG. 18 is a schematic diagram of the SP3T switch 707 of FIG. 7.
Figure 19:
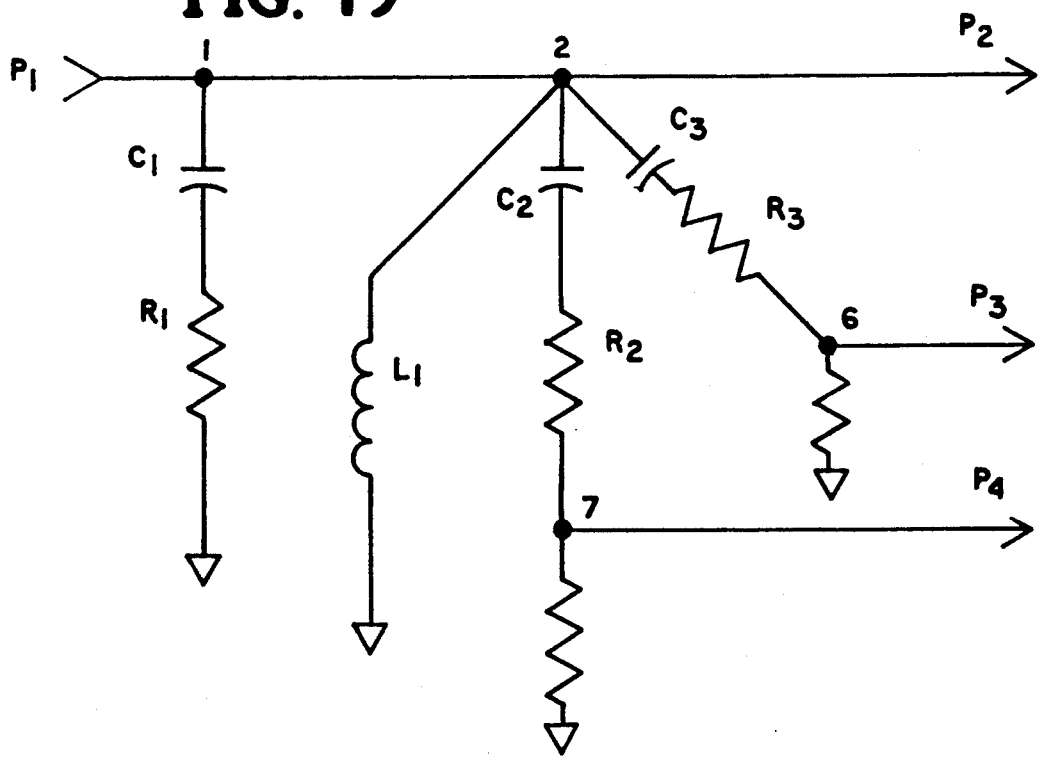
FIG. 19 is a schematic diagram of the switch of FIG. 18 in the high power mode.

A high-frequency switch can achieve low-insertion loss and high isolation when the control element is carefully selected. New technology in GaAs is now available for PIN diodes with high cut-off frequency and low insertion loss. An RF equivalent of a three-way switch is shown in FIGS. 18 and 19. $P_1$, $P_3$ and $P_4$ are the input connections for three difference sources. When $D_1$, $D_{2A}$ and $D_{3A}$ are settled with zero current while $D_{2B}$ and $D_{3B}$ are driven with 10 mA each, RF power at $P_1$ is transmitted to $P_2$ are is isolated from $P_3$ and $P_4$. $L_1$ is inserted to reduce the input VSWR. Transmitted paths for Levels 2 and 3 are selected by alternating the current conductions for each diode. The off diodes are biased at −10 V for high isolation.

Figure 20:
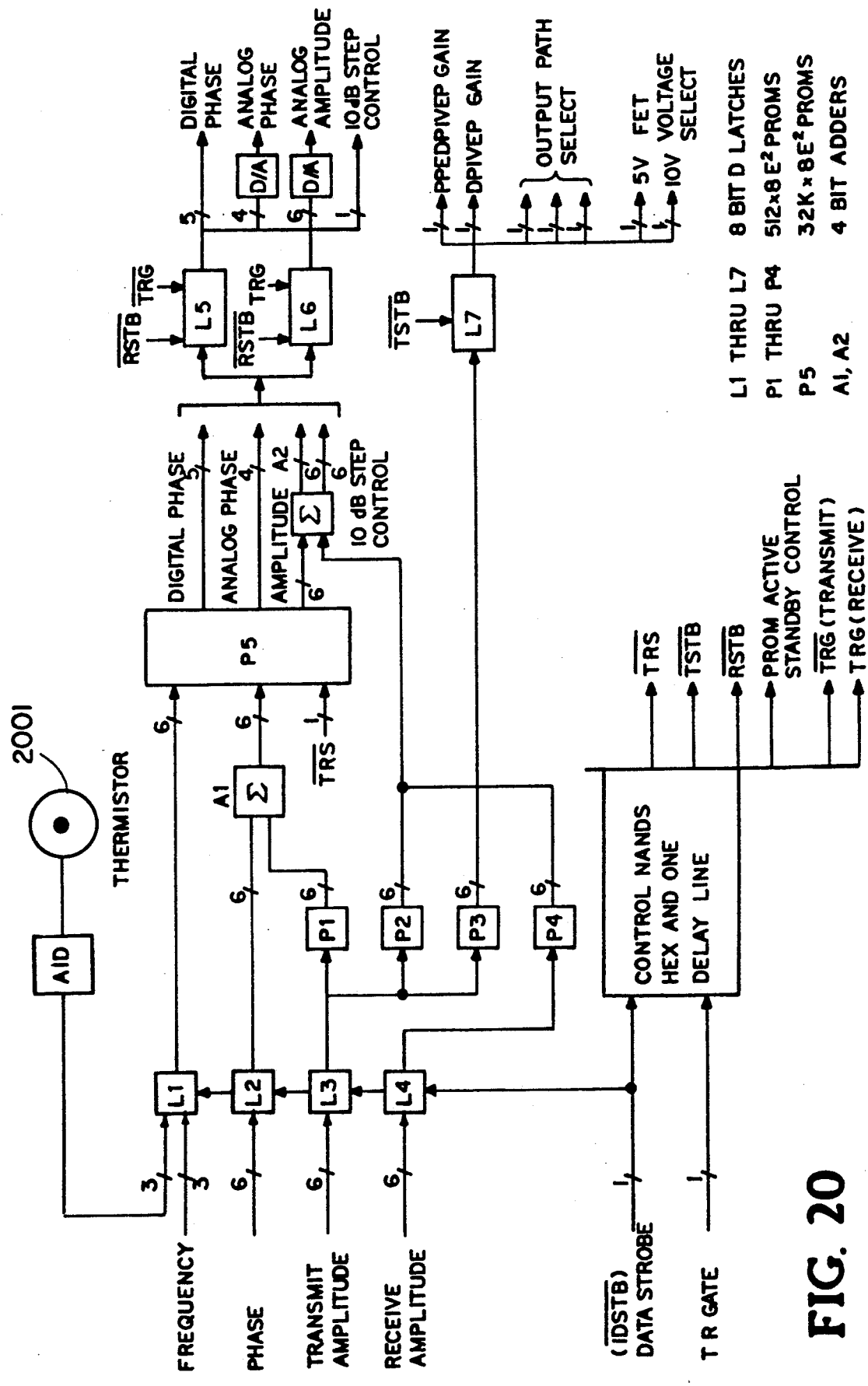
FIG. 20 is a block and flow diagram of the digital control circuitry of the lower left hand portion of FIG. 7.

FIG. 20 illustrates the digital control circuitry for the variable power T/R module. The input data are comprised of frequency (3 bits), Phase (6 bits), transmit amplitude (5 bits) and receive amplitude (6 bits). These data words are latched into the input data latches L1 through L4 at the rising edge of the input data strobe, IDSTB. Also latched at this time is the thermistor 2001 sensed A/D converted temperature data (3 bits). The input data strobe initiates the generation of other timing and control (TRS, TSTB, RSTB) and the active/standby mode control of the Electrically Erasable Programmable Read Only Memories (EEPROMs).

EEPROM, P1 (701) provides phase corrections required during transmit and receive modes. The phase correction during transmit mode depends upon the amplitude, whereas during receive mode, the phase correction is zero. The contents of this EEPROM, P1 are added to the received phase. The transmit and receive phase and amplitude command data and obtained from EEPROM, R5. This EEPROM is addressed by 3 bits of frequency, 3 bits of temperature and 6 bits of phase. EEPROMs, P2 and P4 provide the amplitude correction data for transmit and receive modes of operations, respectively. These data are added to the amplitude data provided by EEPROM, P5. The adder A2 (727) provides 6 bits of amplitude data and one bit of 10 dB step gain control. EEPROM, P3 (703) provides controls for predriver gain, driver gain, output path select and FET voltage select (+5 V/+10 V).

The transmit and receive T/R module commands are stored in output latches L5 and L6, respectively. The final output is comprised of the following:
a) 5 Bits Digital Phase
b) 4 Bits Analog Phase (D/A Converted)
c) 6 Bits Analog Amplitude (D/A Converted)
d) 1 Bit 10 dB Step Control
e) 6 Bits Analog Amplitude (D/A Converted)
f) 1 Bit Predriver Gain Control
g) 1 Bit Drive Gain Control
h) 3 Bits Output Path Select
i) 2 Bits FET+5 V and +10 V Select Key to providing phase and amplitude accuracy and tracking in the T/R module is the use of a GaAs process having excellent uniformity, the use of simple open loop error correction in the module, backed up by an external on-line closed loop error correction system which automatically aligns the array.

The T/R module is capable of both open-loop and closed-loop correction in both phase and amplitude. The open-loop correction compensates for phase shift and amplitude errors over all phase states of the phase shifter, and also corrects for variations over the operating bandwidth and operating temperature range. The module gains and phases are all precalibrated to provide both receive and transmit gain within±0.5 dB and phase within±5 degrees of the reference.

The use of GaAs chips which have high uniformity of phase and amplitude slopes with respect to temperature and frequency is an important factor in meeting the unit-to-unit tracking objectives after initial phase and amplitude slope errors are calibrated out by the PROM. Precise voltage regulators inside the module will minimize errors due to input voltage fluctuations.

This accurate open-loop phase and gain tracking approach makes the T/R module, architecture independent. That is, the module will operate in a non-space-fed antenna architecture. However, the unique space-fed antenna easily lends itself to closed loop monitoring and calibration to null out the remaining phase and amplitude errors.

Closed-loop corrections can be inputted to the module when in service to correct for long-term drifts to achieve and maintain low-sidelobe performance for extended time periods under varying environmental conditions.

Figure 21:
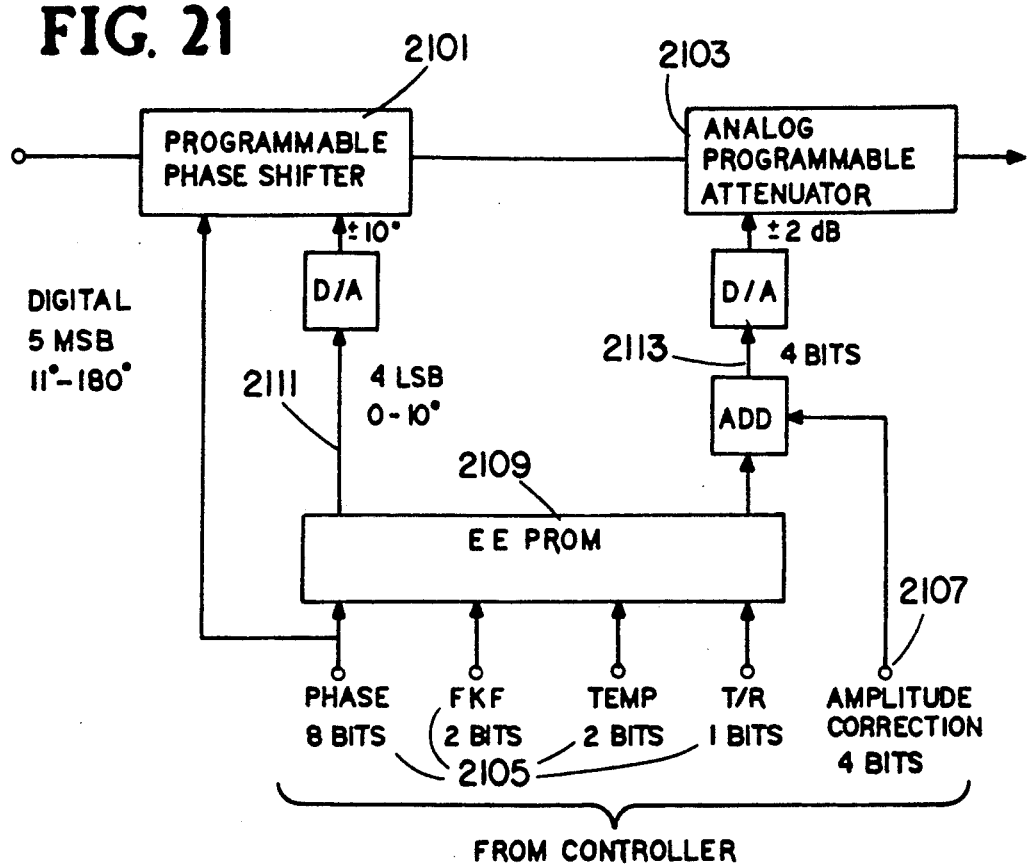
FIG. 21 is a block diagram of the T/R module amplitude and phase correction scheme.

The block diagram of the T/R module amplitude and phase correction scheme is shown in FIG. 21. Phase corrections are produced by an analog phase bit in the phase shifter 2101 to±10 degrees, while gain is corrected in an analog programmable attenuator 2103 in±0.2 dB steps.

The input to the corrector consists of a 13-bit phase code 2105 and a 4-bit amplitude correction term 2107. The former is made up of an 8-bit phase-shift setting, a 2-bit frequency setting, and a 2-bit temperature setting for both the transmit and receive modes. An 8192×8 EEPROM 2109 stows all 256 phase states for 4 frequency, 4 temperatures and for both receive and transmit modes. The EEPROM 2109 output lines are divided into 4-bit phase correction 2111 (1.25 degree resolution) and a 4-bit amplitude correction 2113 (0.25 dB resolution). The EEPROM 2109 contains all the open-loop correction terms which are inputted during the calibration of the modules. The temperature corrections adjust the phase and amplitude to correspond to the average temperature sensitivity slopes so that the module-to-module tracking is improved. The frequency input adjusts for in-band amplitude and phase ripple. A temperature sensor is located in each module controller board.

Figure 22:
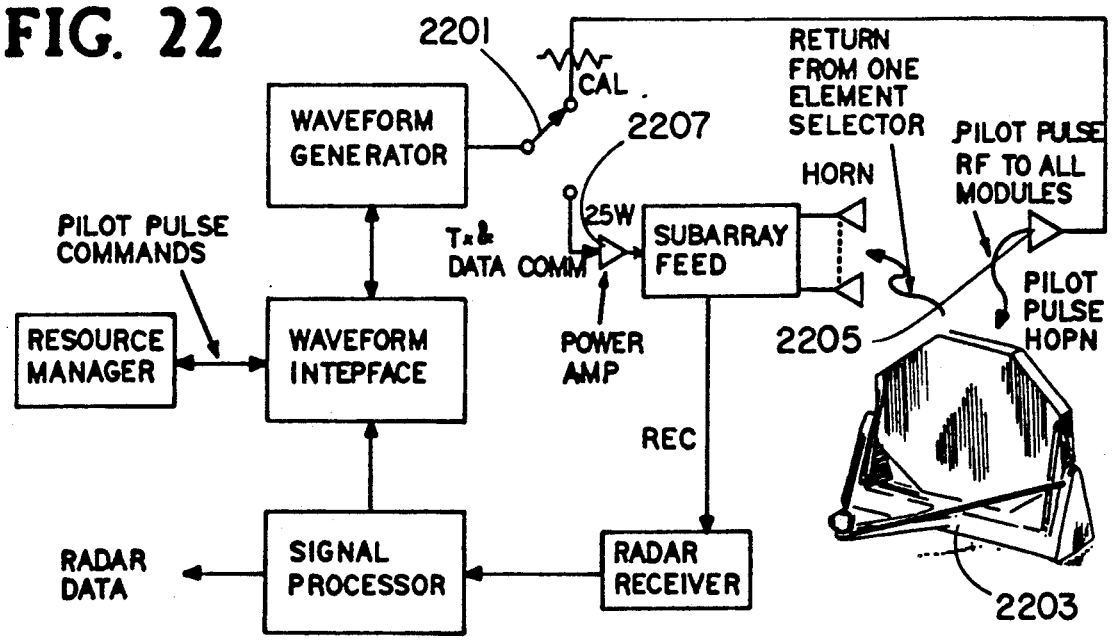
FIG. 22 is a block diagram of the closed loop calibration of the module controller.

Turning to FIG. 22, in the receive-calibrate closed loop mode, with calibrate switch 2201 in the position shown, one "unique" element in array 2203 is addressed for calibration (at a given time), while all other "non-unique" elements are above; the non-unique element voltages are all gated off, and their switches are set to the transmit mode position, or some other special high-isolation position. Signals originating at the calibration horn 2205 and entering the four dipoles pass through the module the same as during receive for the unique element, while signals are rejected in all other elements.

The transmit-calibrate closed loop mode is an off-line mode for use in aligning the antenna beam in the transmit mode. Here, one unique element in array 2203 is set to the transmit mode and the amplifiers 2287 are gated on, while all other elements remain in the command mode. This process continues until each element is aligned. Alignment in transmit is not required frequently because tolerance effects on gain and sidelobes are insignificant for the transmit beam compared to the receive beams. This mode is mainly for use as a check during initial installment.

Prior to transmit and following the beam control commands, a calibration is performed on the previously specified unique element. This element remains in the receive mode, to accept signals initiating from the pilot-pulse calibration horn 2205. The remaining elements all switch to the highest isolation position (transmit mode, or a special off setting). The calibration comprises a measurement of the down link signal passing through the module. Here, the phase and amplitude responses of that particular element, at that particular phase and gain state, are compared with prestored calibration values (ideal amplitude and phase values, or data based on antenna test range measurements). The radar controller reduces the calibration data after all modules have been cycled. Actual update corrections of each element take place during the next alignment cycle on a closed loop basis.

Since the principles of the invention have now been made clear, modifications which are particularly adapted for specific situations without departing from those principles will be apparent to those skilled in the art. The appended claims are intended to cover such modifications as well as the subject matter described, and to only be limited by the true spirit and scope of the invention.

What is claimed as new and desired to be secured by Letters Patent of the United States is:

1. In a phased array radar system wherein microwave power is separately amplified for each antenna aperture rather than being split from a common source a transmit-receive module for inclusion in each aperture channel comprising:
   a first set of terminals of a T/R switching means, a phase shifter, a programmable attenuator, a buffer amplifier, a second set of terminals on said switching means and a power output amplifier connected in series as recited between a transmitter input terminal and a circulator in a transmit position of said switching means;
   means connecting said circulator to an antenna aperture;
   a third set of terminals on said T/R switching means, a low noise amplifier, a second position of said first set of terminals, said phase shifter, said programmable attenuator, said buffer amplifier, and a second position of said second set of terminals connected in series as recited between said antenna aperture and a receiver output terminal in a receive position of said switching means, said third set of terminals being connected between said circulator and ground in the transmit position;
   controller means for providing both closed loop digital and analog phase correction factors to said phase shifter and a closed loop correction factor to said programmable attenuator in order to correct both transmitted and received signals for short term variations over phase states, attenuation range, frequency and temperature employing phase, frequency, temperature and amplitude correction inputs.

2. The transmit-receive module of claim 1 employing means for open loop correction in said controller wherein an EEPROM stores all the open loop correction terms which are inputted during calibration of the module for long term corrections.

3. The transmit-receive module of claim 1 in which said first set of terminals is a double pole double throw switch which in said transmit position connects said transmitter input terminal to the input of said phase shifter and in said receive position connects the output of said low noise amplifier to the input of said phase shifter and the output of said buffer amplifier to the transmitter input terminal which in this mode functions as a receiver output terminal.

4. The transmit-receive module of claim 2 in which said first set of terminals is a double pole double throw switch which in said transmit position connects said transmitter input terminal to the input of said phase shifter and in said receive position connects the output of said low noise amplifier to the input of said phase shifter and the output of said buffer amplifier to the transmitter input terminal which in this mode functions as a receiver output terminal.

5. The transmit-receive module of claim 3 in which said programmable attenuator constitutes an analog attenuator for receipt of analog correction information from said controller and a digital attenuator in series therewith for receipt of digital correction information from said controller.

6. The transmit-receive module of claim 5 in which said power output amplifier comprises a predriver amplifier, a driver amplifier and a power amplifier connected in series from a transmit terminal of said second set of terminals through a set of terminals on a fourth switching means to said circulator, said fourth switching means being on a single pole triple throw switch and having a fixed terminal connected to said circulator and three moveable terminals each connected to one of the outputs of said predriver, driver and power amplifiers with the connection to said power amplifier being direct and the connections to the driver and predriver amplifiers each being through an additional single pole double throw switch; and an EPROM in said controller for switching said additional single pole double throw switches and said fourth switching means in order to switch said power amplifier or said power amplifier and driver amplifier out of series if not needed in order to reduce power consumption and temperature caused by the large number of T/R modules employed.

7. The transmit-receive module of claim 6 in which a controller switch is connected on one side to the bias connections on said predriver, driver and power amplifiers and on the other side to at least two different power levels and means in said controller for switching said controller switch for changing the bias on said bias connections to reduce it when possible again to reduce power consumption and temperature.

8. An amplifier consisting of a plurality of amplifiers each having a bias connection connected in series with means for selectively switching one or more of said amplifiers out of said series if not needed, and switching means connected between a power source and said bias connections for reducing the bias when possible in order to reduce power consumption and temperature.

9. An amplifier consisting of a predriver amplifier, a driver amplifier and a power amplifier connected in series with means for switching said power amplifier, or said driver amplifier and said power amplifier, out of said series if not needed; bias connections on said predriver, driver and power amplifiers; and switching means connected between a power source and said bias connections for reducing the bias when possible in order to reduce power consumption and temperature.

10. The transmit-receive module of claim 1 in which said power output amplifier is class B to further increase the efficiency and reduce temperature.

11. The transmit-receive module of claim 6 in which said predriver, driver and power amplifiers are class B to further increase efficiency and reduce temperature.

12. The transmit-receive module of claim 7 in which said predriver, driver and power amplifiers are class B to further increase efficiency and reduce temperature.

13. The amplifier of claim 8 in which said predriver, driver and power amplifiers are class B to further increase efficiency and reduce temperature.

14. The amplifier of claim 9 in which said predriver, driver and power amplifiers are class B to further increase efficiency and reduce temperature.

15. The transmit-receive module of claim 10 in which said power output amplifier is made by the multifunction self-aligned gate process to further increase efficiency and reduce temperature.

16. The transmit-receive module of claim 10 in which said T/R switching means, said phase shifter, said programmable attenuator and said buffer amplifier are made by the multifunction self-aligned gate process to further increase efficiency and reduce temperature.

17. The transmit-receive module of claim 11 or 12 in which said predriver, driver and power amplifiers are made by the multifunction self-aligned gate process to further increase efficiency and reduce temperature.

18. The transmit-receive module of claim 11 or 12 in which said T/R switching means, said phase shifter, said analog attenuator, said digital attenuator and said buffer amplifier are made by the multifunction self-aligned gate process to further increase efficiency and reduce temperature.

19. The amplifier of claim 13 or 14 in which said predriver, driver and power amplifier are made by the multifunction self-aligned gate process to further increase efficiency and reduce temperature.

* * * * *